United States Patent
Park

(10) Patent No.: US 11,334,423 B2
(45) Date of Patent: May 17, 2022

(54) MEMORY DEVICES FOR PERFORMING REPAIR OPERATION, MEMORY SYSTEMS INCLUDING THE SAME, AND OPERATING METHODS THEREOF

(71) Applicant: Samsung Electronics Co., Ltd., Suwon-si (KR)

(72) Inventor: Yongsang Park, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/934,748

(22) Filed: Jul. 21, 2020

(65) Prior Publication Data

US 2021/0200625 A1 Jul. 1, 2021

(30) Foreign Application Priority Data

Dec. 26, 2019 (KR) .................. 10-2019-0175040

(51) Int. Cl.
*G06F 11/00* (2006.01)
*G06F 11/07* (2006.01)
*G11C 8/08* (2006.01)

(52) U.S. Cl.
CPC ...... *G06F 11/0793* (2013.01); *G06F 11/0727* (2013.01); *G06F 11/0751* (2013.01); *G11C 8/08* (2013.01)

(58) Field of Classification Search
CPC ............. G06F 11/0727; G06F 11/073; G06F 11/1008; G06F 11/2053; G06F 11/1068; G06F 11/1072; G06F 11/0793; G06F 11/0751; G06F 11/1048; G06F 11/108; G06F 11/1469; G06F 3/0658; G06F 3/0604; G06F 3/0679; G11C 29/18; G11C 29/006; G11C 29/787; G11C 29/702; G11C 8/08; G11C 29/06; G11C 29/835; G11C 29/4401; G11C 29/52; G11C 29/781; G11C 29/789; G11C 29/808; G11C 29/824
USPC ...................................... 714/1–57
See application file for complete search history.

(56) References Cited

U.S. PATENT DOCUMENTS

| | | | |
|---|---|---|---|
| 5,974,564 A | 10/1999 | Jeddeloh | |
| 6,701,456 B1 * | 3/2004 | Biessener | G06F 11/1471 714/16 |
| 7,295,480 B2 | 11/2007 | McPartland | |
| 7,793,173 B2 | 9/2010 | Chang et al. | |
| 9,202,595 B2 | 12/2015 | Wilson et al. | |
| 9,349,491 B1 * | 5/2016 | Morgan | G11C 29/78 |

(Continued)

FOREIGN PATENT DOCUMENTS

| KR | 10-2017-0103435 A | 9/2017 |
|---|---|---|
| KR | 10-2018-0102904 A | 9/2018 |

*Primary Examiner* — Sarai E Butler
(74) *Attorney, Agent, or Firm* — Myers Bigel, P.A.

(57) ABSTRACT

A memory device includes a mode register set configured to store a first repair mode, a second repair mode, and a second repair off mode, and a repair control circuit configured to perform a first repair operation for permanently repairing a first wordline corresponding to a defective address to a first redundancy wordline in the first repair mode, to perform a second repair operation for temporarily repairing the first wordline corresponding to the defective address to a second redundancy wordline in the second repair mode, and to turn off a repair logic that is configured to perform the second repair operation in the second repair off mode to access old data after the second repair operation.

20 Claims, 23 Drawing Sheets

(56) References Cited

U.S. PATENT DOCUMENTS

| | | | |
|---|---|---|---|
| 9,922,729 B2 | 3/2018 | Wilson et al. | |
| 2009/0006764 A1* | 1/2009 | Blumrich | G06F 12/0831 |
| | | | 711/141 |
| 2010/0169705 A1* | 7/2010 | Fujii | G11C 29/72 |
| | | | 714/6.12 |
| 2010/0246235 A1* | 9/2010 | Gouin | G11C 7/12 |
| | | | 365/72 |
| 2011/0131395 A1* | 6/2011 | Georgiades | G06F 7/724 |
| | | | 712/221 |
| 2011/0141826 A1* | 6/2011 | Lee | G06F 12/0895 |
| | | | 365/189.08 |
| 2013/0083612 A1 | 4/2013 | Son et al. | |
| 2013/0339809 A1* | 12/2013 | Ambroladze | G06F 11/08 |
| | | | 714/54 |
| 2014/0078842 A1* | 3/2014 | Oh | G11C 29/785 |
| | | | 365/200 |
| 2015/0194207 A1* | 7/2015 | Lee | G11C 11/419 |
| | | | 365/154 |
| 2016/0260504 A1 | 9/2016 | You | |
| 2016/0300627 A1 | 10/2016 | You et al. | |
| 2016/0307647 A1 | 10/2016 | Morgan et al. | |
| 2017/0185499 A1 | 6/2017 | Lee et al. | |
| 2017/0256326 A1 | 9/2017 | You | |
| 2018/0107597 A1* | 4/2018 | Jo | G06F 13/1647 |
| 2018/0247699 A1 | 8/2018 | Pope et al. | |
| 2018/0261297 A1* | 9/2018 | Kim | G11C 29/04 |
| 2019/0311255 A1* | 10/2019 | Wang | G06F 12/0646 |
| 2019/0333601 A1 | 10/2019 | Wilson et al. | |
| 2020/0117558 A1* | 4/2020 | Wilson | G06F 11/0751 |
| 2020/0243158 A1* | 7/2020 | Wilson | G11C 7/1087 |
| 2021/0109826 A1* | 4/2021 | Bueb | G06F 11/0772 |

* cited by examiner

MEMORY DEVICES FOR PERFORMING REPAIR OPERATION, MEMORY SYSTEMS INCLUDING THE SAME, AND OPERATING METHODS THEREOF

CROSS-REFERENCE TO RELATED APPLICATION(S)

This application claims the benefit of priority to Korean Patent Application No. 10-2019-0175040, filed on Dec. 26, 2019 in the Korean Intellectual Property Office, the disclosure of which is incorporated herein by reference in its entirety.

BACKGROUND

The present disclosure relates to memory devices and systems, and operating methods thereof. Generally, a memory device may be repaired even after being packaged through a packaging process. In this case, a repair operation is known as a post-package repair operation. In a post-package repair operation, a failed memory cell which has not been found in a wafer state but occurs after a packaging process may be repaired using an electrical fuse means.

SUMMARY

An example embodiment of the present inventive concept is to provide a memory device for performing a repair operation which may improve reliability of data, a memory system including the same, and an operating method thereof.

According to an example embodiment of the present inventive concept, a memory device includes a mode register set configured to store a first repair mode, a second repair mode, and a second repair off mode; and a repair control circuit configured to perform a first repair operation for permanently repairing a first wordline corresponding to a defective address to a first redundancy wordline in the first repair mode, to perform a second repair operation for temporarily repairing the first wordline corresponding to the defective address to a second redundancy wordline in the second repair mode, and to turn off a repair logic that is configured to perform the second repair operation in the second repair off mode to access old data after the second repair operation.

According to an example embodiment of the present inventive concept, a memory device includes a normal wordline activation logic configured to output a normal wordline activation signal in response to an active row address being matched; first redundancy boxes configured to output a post package repair (PPR) wordline activation signal in response to the active row address being matched; and at least one second redundancy box configured to output a soft post package repair (sPPR) wordline activation signal in response to the active row address being matched, and wherein the at least one second redundancy box is inactivated in response to old data access information.

According to an example embodiment of the present inventive concept, an operating method of a memory device includes performing a repair operation for replacing a wordline corresponding to an address with a redundancy wordline in response to a repair request from an external device; receiving old data access information from the external device; and outputting old data from memory cells connected to the wordline corresponding to the address in response to a read request from the external device after the receiving the old data access information.

According to an example embodiment of the present inventive concept, a memory system includes at least one memory device; and a controller configured to control the at least one memory device, and wherein the at least one memory device is configured to turn off a soft post package repair (sPPR) logic in response to old data access information after performing an sPPR operation, and to output old data from memory cells connected to a normal wordline or a repair wordline corresponding to an address to the controller.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings.

Figure 1:
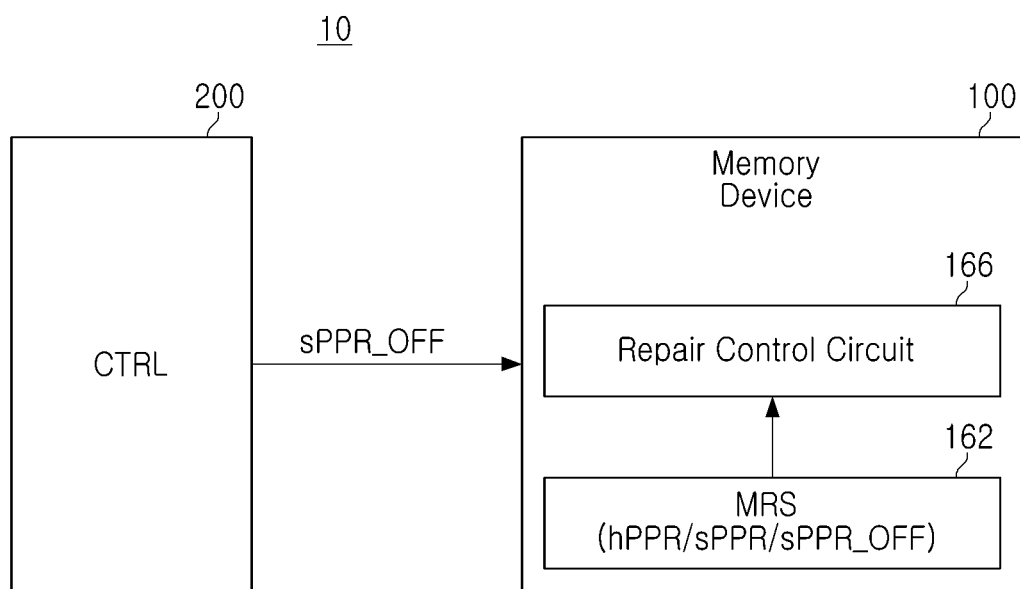
FIG. 1 is a diagram illustrating an example of a memory system according to an example embodiment.

FIG. 1 is a diagram illustrating an example of a memory system 10 according to an example embodiment. Referring to FIG. 1, a memory system 10 may include a memory device 100 and a controller (CTRL) 200 for controlling the memory device 100.

The memory device 100 may be implemented by a volatile memory device or a non-volatile memory device. The volatile memory device may be a static random access memory (SRAM), a dynamic random access memory (DRAM), a synchronous DRAM (SDRAM), or the like. The non-volatile memory device may be a NAND flash memory, a vertical NAND flash memory (VNAND), a NOR flash memory, a resistive random access memory (RRAM), a phase change memory (PRAM), a magnetoresistive random access memory (MRAM), a ferroelectric random access memory (FRAM), a spin transfer torque random access memory (STT-RAM), or the like. In the description below, the memory device 100 may be implemented as a DRAM for ease of description.

Also, the memory device 100 may include a mode register set (MRS) 162 and a repair control circuit 166.

The MRS 162 may be implemented to store a plurality of repair operation modes. The plurality of repair operation modes may include a hard post package repair (hPPR) mode, a soft post package repair (sPPR) mode, and an sPPR off (sPPR_OFF) mode.

The repair control circuit 166 may be implemented to perform a repair operation according to a stored repair operation mode of the MRS 162. In the hPPR mode, the repair control circuit 166 may perform a repair operation for permanently repairing a wordline corresponding to a defective address to a redundancy wordline. In the sPPR mode, the repair control circuit 166 may perform a repair operation for temporarily repairing a wordline corresponding to a defective address to a redundancy wordline. In the sPPR mode, a repair address related to the repair control circuit 166 may be received from a controller 200 and may be stored, and the repair operation may be performed based on the stored repair address.

In an example embodiment, the entering the hPPR mode or the sPPR mode may be protected through a mode register set (MRS) guard key to inhibit/prevent unintended hPPR programming. Sequential guard keys may be the same in the hPPR mode or the sPPR mode. In an example embodiment, the entering the sPPR may be performed through register activation. Also, an active (ACT) command may be used to transmit a bank of a row or a row address replaced in the memory device 100. In an example embodiment, after a tRCD (e.g., the number of clock cycles between issuing the ACT command and a read/write command) section, a write (WR) command may be used to select an individual memory device through DQ bits, and to transmit a repair address to an internal register of a selected memory device. In an example embodiment, after a write recovery time and a precharge (PRE) section, the sPPR mode may be terminated, and a normal operation may be resumed. In an example embodiment, the memory device 100 may maintain soft repair information while operating. When power of the memory device 100 is removed, the soft repair information may return to be in a repair restricted state.

In the sPPR_OFF mode, the repair control circuit 166 may turn off an sPPR logic after performing the sPPR operation, and may access memory cells connected to a wordline corresponding to a defective address and may output old data.

A DRAM may include several billion or more cells. For example, a single 16 gigabyte (GB) DRAM may include 17,179,869,184 cells. For a normal operation, all the cells may need to normally operate. The DRAM may include spare redundancy cells therein as provision for defects generated in manufacturing and test processes. By replacing a row or a column including a failed cell with a row or column including a redundancy cell, the failed cell may be saved/repaired. Generally, a DRAM may be manufactured such that all the defects generated in a production process including manufacturing and test processes may be repaired and all the cells may normally operate.

A stress test considering deteriorations, and the like, which may occur while a DRAM is used may include a process of generating a defect which may likely occur to an actual user of a DRAM in advance and repairing the defect. Such a stress test, however, may not be able to prevent all the defects occurring in actual use of a DRAM in advance. Recently, as a solution for defects occurring in a user stage, a relevant circuit has been included in a DRAM such that a user may directly perform a repair operation through a post package repair (PPR) operation.

The PPR operation of the DRAM may be divided into the hPPR and the sPPR. The hPPR may perform a repair operation by changing physical fuse information in both the manufacturing stage and the testing stage. In this case, all fuse information including respective fuse information may be loaded in a redundancy processing circuit of an address decoder again. In this case, all data currently in tasking may be lost, and a great amount of time may be consumed until the data is in a usable state. For this reason, even when a failed cell occurs in a situation in which a DRAM needs to be continuously used, the hPPR may not be performed instantly.

The above-described issue may be addressed using the sPPR. The sPPR may be a random repair method, rather than the changing of physical fuse information, and when power is turned off, respective repair information may disappear. However, the sPPR may be repaired for a relatively short period of time, and data of addresses other than the repaired address may be used as is without being lost. For this reason, when a failed cell occurs in a situation in which a DRAM needs to be continuously used, by replacing the respective failed address with a redundancy address through the sPPR, the DRAM may be continuously used without interruption.

A general sPPR operation may repair a row address of a failed address to a redundancy address. After the repairing operation, as it is unable to access data stored in the same row in addition to the existing failed cell, loss of data may occur. For example, in a DDR5 DRAM, as a single row address may activate 8 K cells, in the sPPR operation, even when there is one failed cell, loss of 8 Kb data may occur. To inhibit/prevent this, generally, an operation of copying data of the respective row address to the other address may be performed/necessary before performing the sPPR. However, when a DRAM in use is busy such that there is no time for copying the 8 Kb, a problem may occur.

The sPPR operation according to the example embodiment may access a data region prior to performing the sPPR operation by entering the sPPR_OFF mode after performing the sPPR operation. In the memory system 10 according to the example embodiment, by including the memory device 100 which may enable an access to old data prior to performing the sPPR even after performing the sPPR operation, reliability of data and overall performance may improve.

Figure 2:
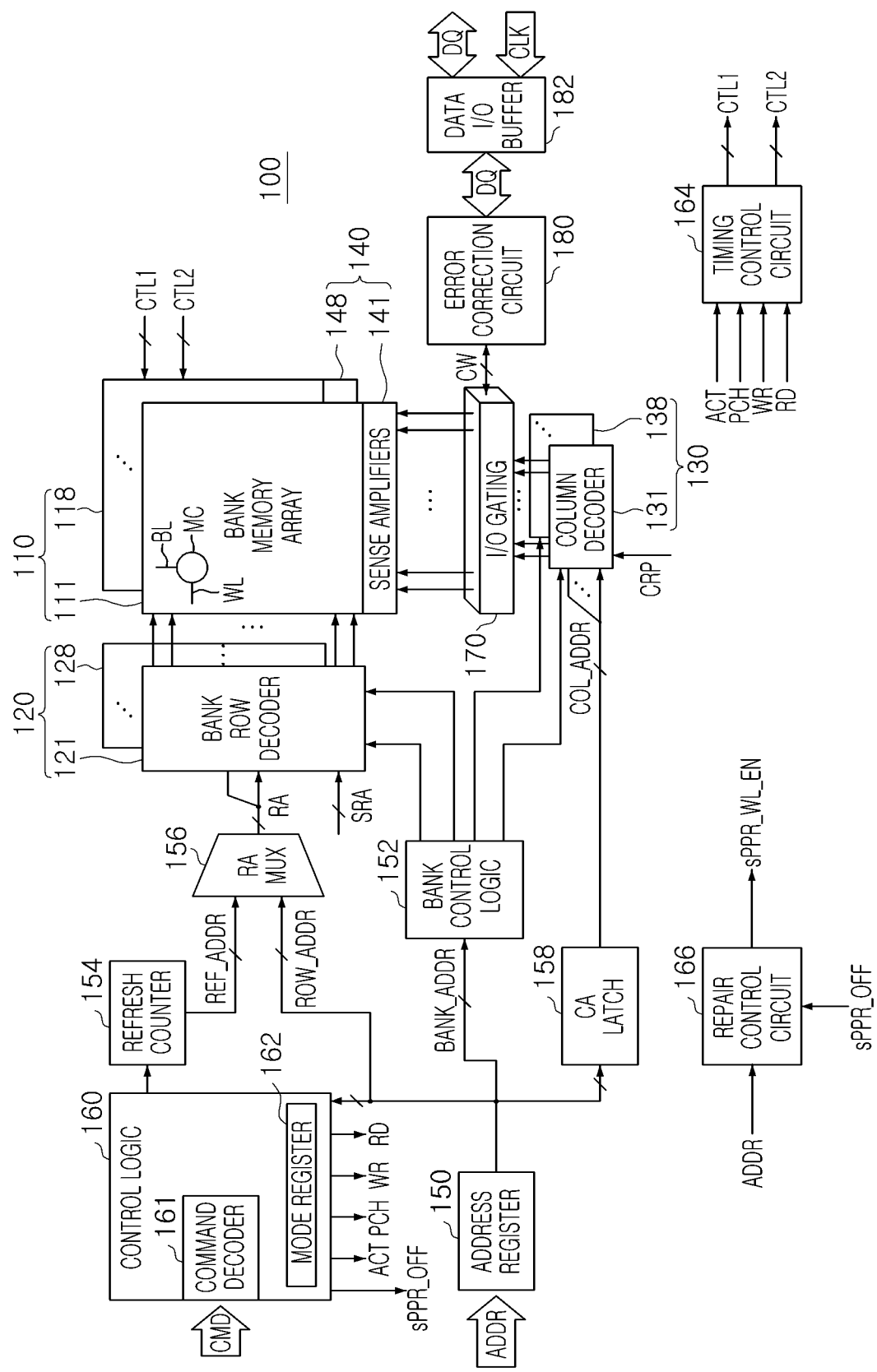
FIG. 2 is a diagram illustrating an example of a memory device according to an example embodiment.

FIG. 2 is a diagram illustrating an example of a memory device 100 according to an example embodiment. Referring to FIG. 2, the memory device 100 may include a memory cell array 110, a row decoder 120, a column decoder 130, a sense amplifier circuit 140, an address register 150, a bank control logic 152, a refresh counter 154, a row address multiplexer (RA MUX) 156, a column address (CA) latch 158, a control logic 160, a repair control circuit 166, a timing control circuit 164, an input and output (I/O) gating circuit 170, an error correction circuit 180, and a data input and output buffer 182.

The memory cell array 110 may include first to eighth bank arrays 111 to 118. The number of the bank arrays included in the memory cell array 110, however, is not limited thereto.

The row decoder 120 may include first to eighth bank row decoders 121 to 128 connected to the first to eighth bank arrays 111 to 118, respectively.

The column decoder 130 may include first to eighth bank column decoders 131 to 138 connected to the first to eighth bank arrays 111 to 118, respectively.

The sense amplifier circuit 140 may include first to eighth bank sense amplifiers 141 to 148 connected to the first to eighth bank arrays 111 to 118, respectively.

The first to eighth bank arrays 111 to 118, the first to eighth bank row decoders 121 to 128, the first to eighth bank column decoders 131 to 138, and the first to eighth bank sense amplifiers 141 to 148 may be included in first to eighth banks, respectively. Each of the first to eighth bank arrays 111 to 118 may include a plurality of memory cells MC disposed at a point at which wordlines WL intersect with bit lines BL.

The address register 150 may receive an address ADDR having a bank address BANK_ADDR, a row address ROW_ADDR, and a column address COL_ADDR from an external memory controller and may store the address ADDR. The address register 150 may provide the received bank address BANK_ADDR to the bank control logic 152, may provide the received row address ROW_ADDR to the row address multiplexer 156, and may provide the received column address COL_ADDR to the column address latch 158.

The bank control logic 152 may generate bank control signals in response to the bank address BANK_ADDR. A bank row decoder of the first to eighth bank row decoders 121 to 128 corresponding to the bank address BANK_ADDR may be activated in response to bank control signals. A bank column decoder of the first to eighth bank column decoders 131 to 138 corresponding to the bank address BANK_ADDR may be activated in response to bank control signals.

The row address multiplexer 156 may receive a row address ROW_ADDR from the address register 150, and may receive a refresh row address REF_ADDR from the refresh counter 154. The row address multiplexer 156 may selectively output the row address ROW_ADDR or the refresh row address REF_ADDR as a row address RA. The row address RA output from the row address multiplexer 156 may be applied to each of the first to eighth bank row decoders 121 to 128.

A bank row decoder of the first to eighth bank row decoders 121 to 128 activated by the bank control logic 152 may decode the row address RA output from the row address multiplexer 156 and may activate a wordline corresponding to the row address. For example, the activated bank row decoder may apply a wordline driving voltage to a wordline corresponding to the row address. Also, the activated bank row decoder may activate a wordline corresponding to the row address and may also activate a redundancy wordline corresponding to the redundancy row address output from the repair control circuit 166.

The column address latch 158 may receive the column address COL_ADDR from the address register 150, and may temporarily store the received column address COL_ADDR. Also, the column address latch 158 may gradually increase the received column address COL_ADDR in a burst mode. The column address latch 158 may apply the column address COL_ADDR, temporarily stored or gradually increased, to each of the first to eighth bank column decoders 131 to 138.

A bank column decoder of the first to eighth bank column decoders 131 to 138 activated by the bank control logic 152 may activate a sense amplifier corresponding to the bank address BANK_ADDR and the column address COL_ADDR through the input and output gating circuit 170. Also, the activated bank column decoder may perform a column repair operation in response to a column repair signal CRP output from the repair control circuit 166.

The control logic 160 may be implemented to control an operation of the memory device 100. For example, the control logic 160 may generate control signals for the memory device 100 to perform a write operation or a read operation. The control logic 160 may include a command decoder 161 for decoding a command CMD received from a memory controller and a mode register 162 for setting an operation mode of the memory device 100.

For example, the command decoder 161 may generate operation control signals ACT, PCH, WR, and RD corresponding to the command CMD by decoding a write enable signal, a row address strobe signal, a column address strobe signal, a chip select signal, and the like. The control logic 160 may provide the operation control signals ACT, PCH, WR, and RD to the timing control circuit 164. The operation control signals ACT, PCH, WR, and RD may include an active signal ACT, a precharge signal PCH, a write signal WR, and a read signal RD. The timing control circuit 164 may generate first control signals CTL1 for controlling a voltage level of the wordline WL and second control signals CTL2 for controlling a voltage level of the bit line BL, in response to the operation control signals ACT, PCH, WR, and RD, and may provide the first control signals CTL1 and the second control signals CTL2 to the memory cell array 110.

The repair control circuit 166 may generate repair control signals, including a signal CRP, for controlling repair operations of a first cell region and a second cell region of at least one of the bank arrays based on the row address ROW_ADDR and the column address COL_ADDR of the address ADDR (or an access address), and fuse information of each of the wordlines. The repair control circuit 166 may provide a redundancy row address to a corresponding bank row decoder, may provide the column repair signal CRP to a corresponding bank column decoder, and may provide a select signal and the enable signal SRA to a block control circuit related to a corresponding redundancy array block.

Also, the repair control circuit 166 may generate an hPPR wordline activation signal in response to the address ADDR in the hPPR mode stored in a mode register set 162. Also, the repair control circuit 166 may generate an sPPR wordline activation signal sPPR_WL_EN in response to the address ADDR in the sPPR mode stored in the mode register set 162. The repair control circuit 166 may also turn off the sPPR logic in the sPPR_OFF mode stored in the mode register set 162 and may generate a normal wordline activation signal to access old data.

In an example embodiment, the repair control circuit 166 may change a repair unit based on the address ADDR and the fuse information. For example, the repair control circuit 166 may change a type and the number of repair address bits based on the address ADDR and the fuse information.

Each of input and output gating circuits of the input and output gating circuit 170 may include an input data mask logic, read data latches for storing data output from the first to eighth bank arrays 111 to 118, and write drivers for writing data to the first to eighth bank arrays 111 to 118, along with circuits for gating input and output data.

A codeword CW to be read in one of the first to eighth bank arrays 111 to 118 may be sensed by a sense amplifier corresponding to one of the bank arrays, and may be stored in the read data latches. The codeword CW stored in the read data latches may be provided to a memory controller through the data input and output buffer 182 after error checking and correcting (ECC) decoding is performed by the error correction circuit 180. Data DQ to be written in one of first to eighth bank arrays 110 to 118 may be written in one of the bank arrays through the write drivers after the ECC encoding is performed in the error correction circuit 180.

The data input and output buffer 182 may provide the data DQ to the error correction circuit 180 based on a clock signal CLK provided from the memory controller in a write operation, and may provide the data DQ provided from the error correction circuit 180 to the memory controller in a read operation.

The error correction circuit 180 may generate parity bits based on data bits of the data DQ provided from the data input and output buffer 182 in the write operation, and may provide the codeword CW including the data DQ and parity bits to the input and output gating circuit 170, and the input and output gating circuit 170 may write the codeword CW on the bank array.

Also, the error correction circuit 180 may be provided with the codeword CW read in one of the bank arrays from the input and output gating circuit 170 in the read operation. The error correction circuit 180 may perform the ECC decoding for the data DQ using the parity bits included in the read codeword CW, may correct at least one error bit included in the data DQ, and may provide the corrected error bit to the data input and output buffer 182.

The memory device 100 according to the example embodiment may receive repair information, may set a repair operation mode corresponding to the received repair information, and may perform a repair operation according to the determined repair operation mode. The memory device 100 may also access old data even after the sPPR operation by entering the sPPR_OFF mode.

Figure 3:
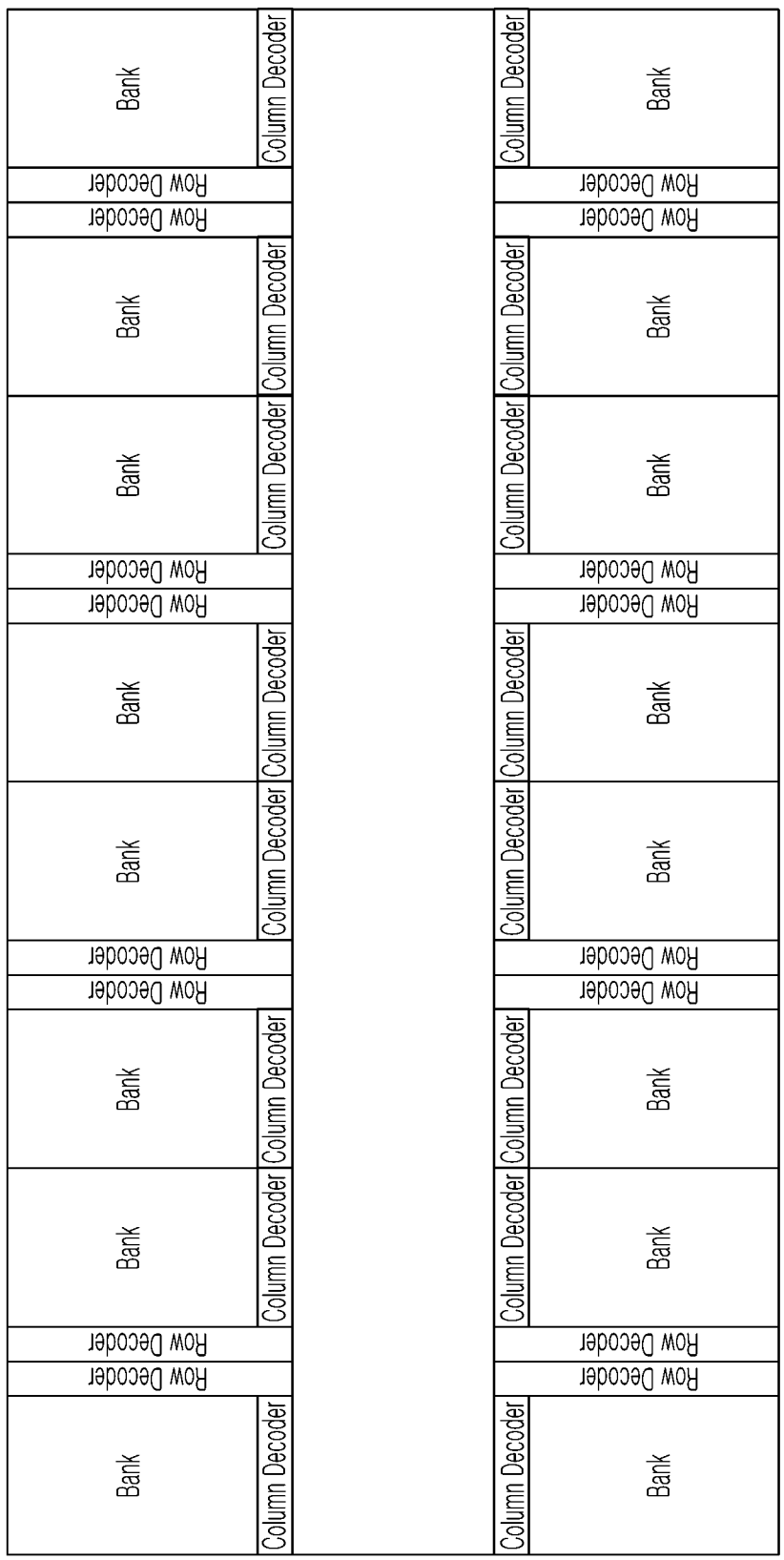
FIG. 3 is a schematic diagram illustrating a structure of a memory device according to an example embodiment.

FIG. 3 is a schematic diagram illustrating a structure of a memory device 100 according to an example embodiment. A memory device 100 may read and write data through a row address applied when an active command is received, and a column address applied when a read command or a write command is received. A row decoder may receive a row address applied when the active command is received and may activate a certain wordline. When a single wordline is activated, the memory device 100 may enter a state in which an access to several thousands of pieces of cell data connected to the respective wordline may be available through the read or write command. When a single failed cell is included even in one of the several thousands of cells, the memory device 100 may not normally operate.

The numbers and the arrangements of bank, the row decoder, and the column decoder illustrated in FIG. 3 are merely examples.

Figure 4:
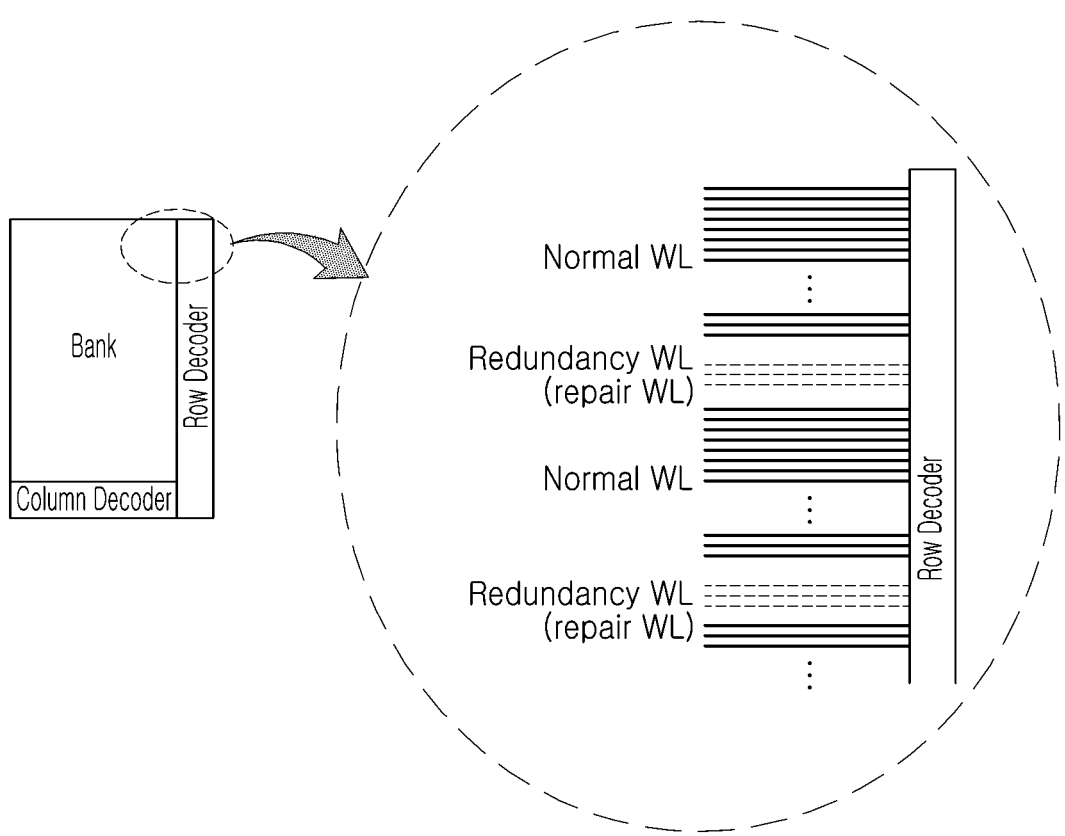
FIG. 4 is a schematic diagram illustrating a redundancy wordline in a memory device according to an example embodiment.

FIG. 4 is a schematic diagram illustrating a redundancy wordline in a memory device 100 according to an example embodiment. Referring to FIG. 4, redundancy (repair) wordlines may be disposed among normal wordlines. When a failed cell is generated in a manufacturing stage or a testing stage, a wordline including the respective cell may be repaired to a redundancy wordline.

Figure 5:
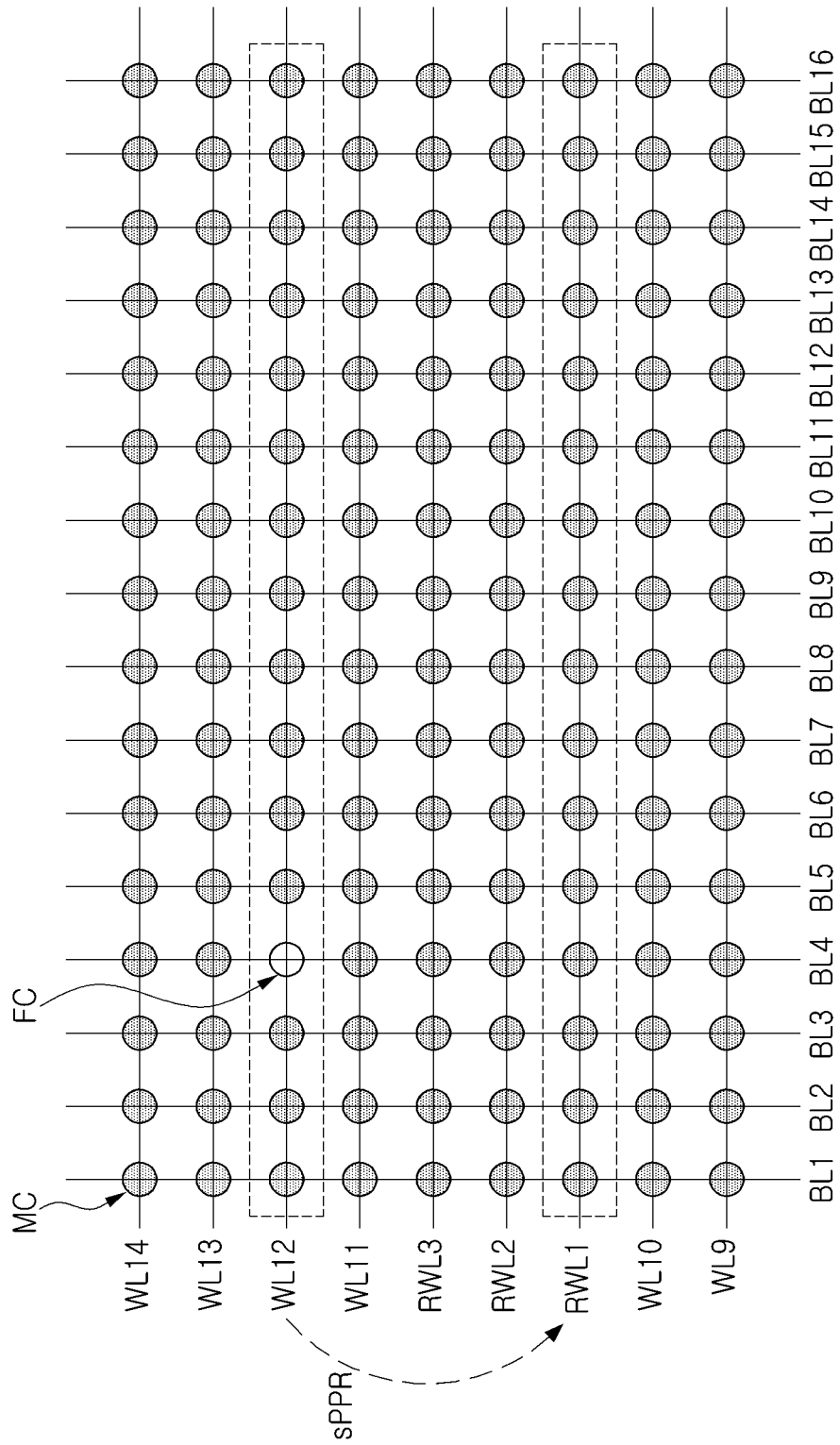
FIG. 5 is a diagram illustrating an example of a repair operation of a memory device according to an example embodiment.

FIG. 5 is a diagram illustrating an example of a repair operation of a memory device 100 according to an example embodiment. In FIG. 5, it may be assumed that a memory cell connected to a twelfth wordline WL12 and a fourth bit line BL4 becomes a failed cell FC while the memory device 100 operates. The controller 200 may transmit an sPPR command for the twelfth wordline WL12 to the memory device 100 depending on (e.g., in response to detecting) a presence of the failed cell FC. The memory device 100 may replace the twelfth wordline WL12 with a first redundancy wordline RWL1 in response to the sPPR command.

Figure 6:
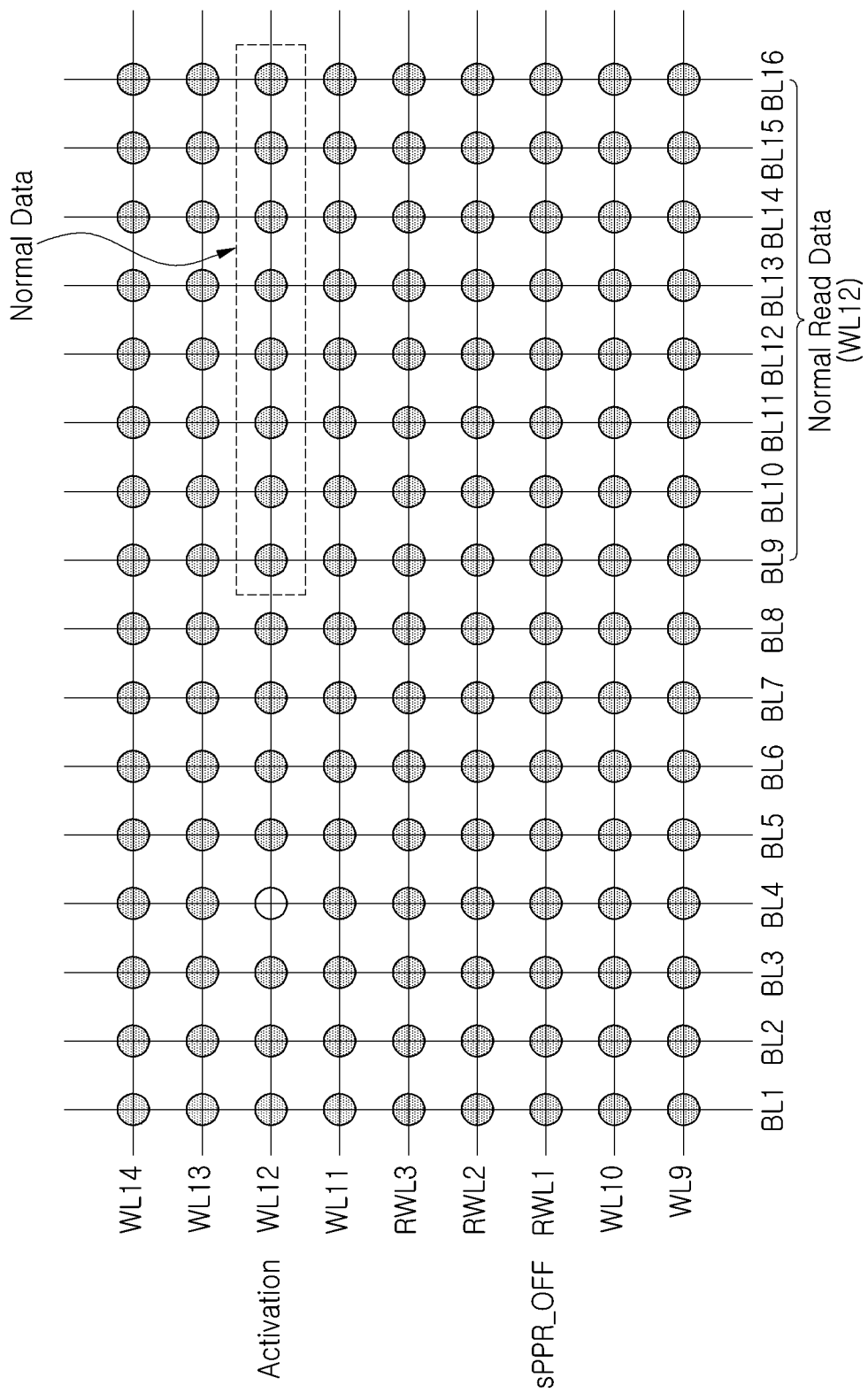
FIG. 6 is a diagram illustrating an example of an old data access operation after a repair operation of a memory device according to an example embodiment.

FIG. 6 is a diagram illustrating an example of an old data access operation after a repair operation of a memory device 100 according to an example embodiment. Referring to FIG. 6, after the sPPR operation is performed in FIG. 5, a controller 200 may command the memory device 100 to enter a sPPR_OFF mode. Accordingly, the memory device 100 may operate in the sPPR_OFF mode. As a sPPR logic is turned off in the sPPR_OFF mode, a normal wordline prior to the sPPR operation, a twelfth wordline WL12, may be activated in response to an address received from the controller 200. Accordingly, normal data from memory cells connected to the activated wordline WL12 may be output to the controller 200.

Figure 7:
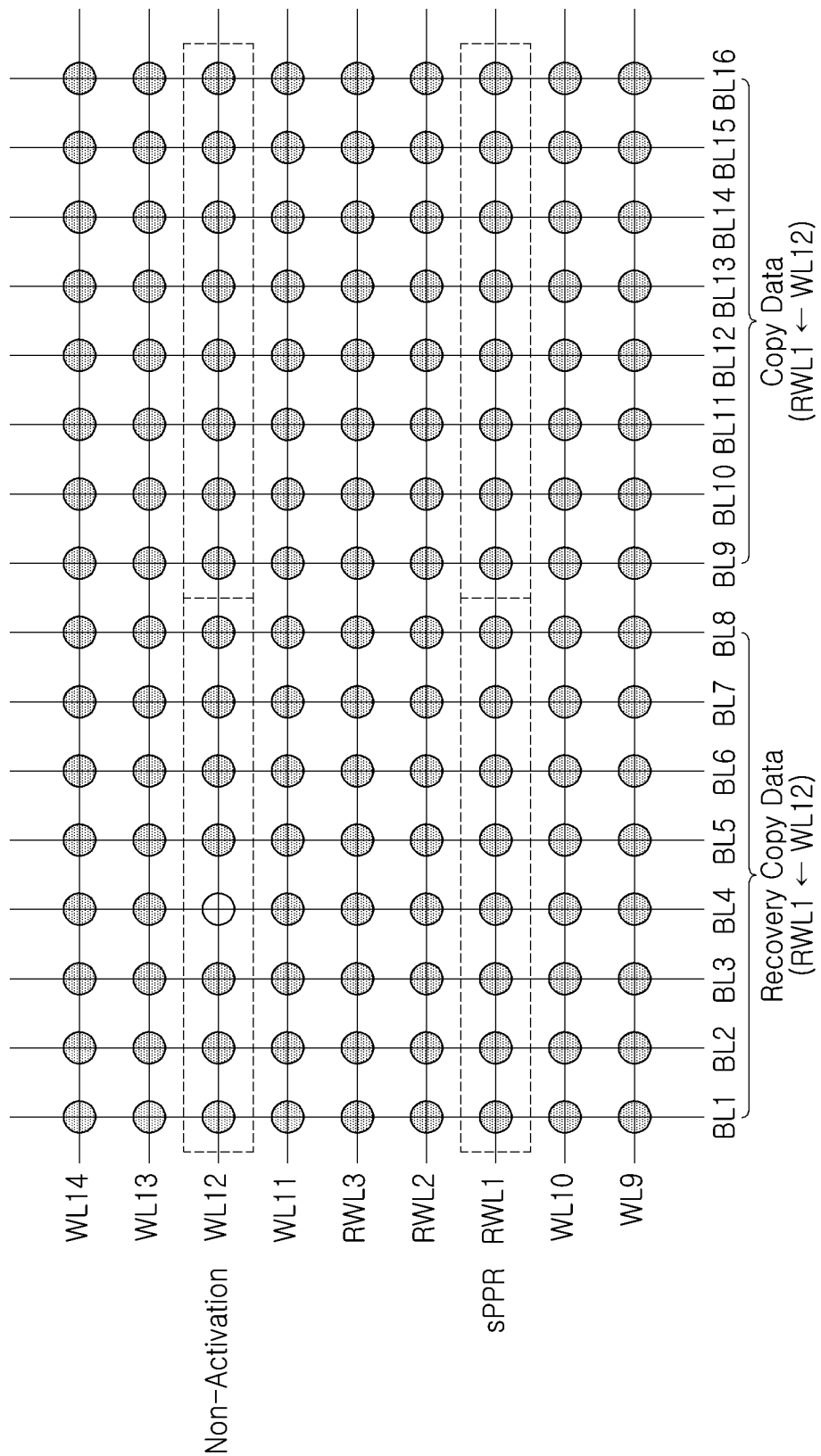
FIG. 7 is a diagram illustrating an example of an operation of copying old data after a repair operation of a memory device according to an example embodiment.

FIG. 7 is a diagram illustrating an example of an operation of copying old data after a repair operation of a memory device 100 according to an example embodiment. Referring to FIG. 7, the controller 200 may change an operation mode of the memory device 100 to an sPPR mode after receiving the old data in FIG. 6. Thereafter, the controller 200 may use copied data recovered from memory cells connected to the normal wordline WL12 and copied data as redundancy memory cells connected to a redundancy wordline RWL1. Accordingly, a repair operation for a failed cell may be completed.

Figure 8A:
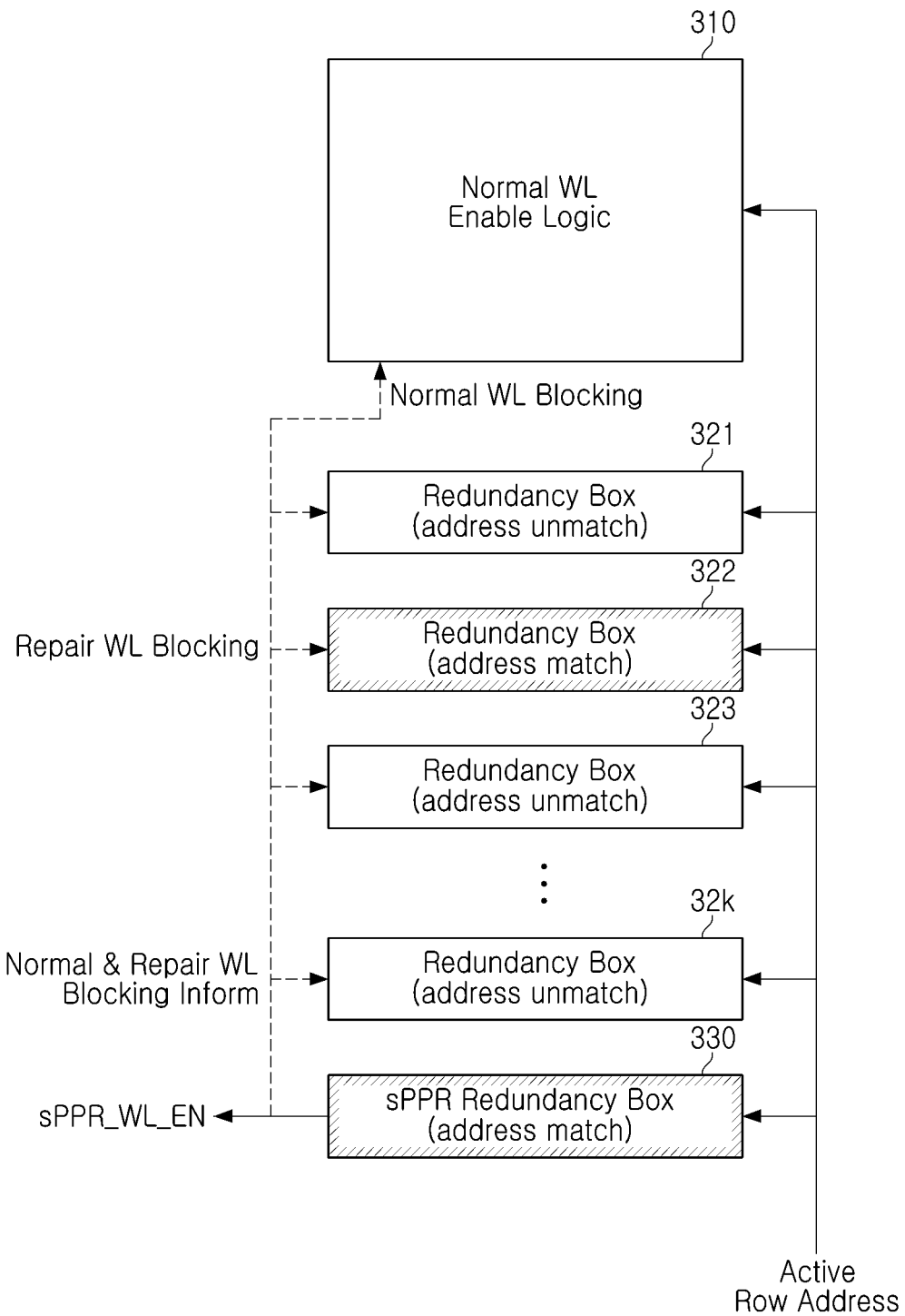
FIGS. 8A and 8B are diagrams conceptually illustrating an operation of a wordline activation logic of a memory device according to an example embodiment.
Figure 8B:
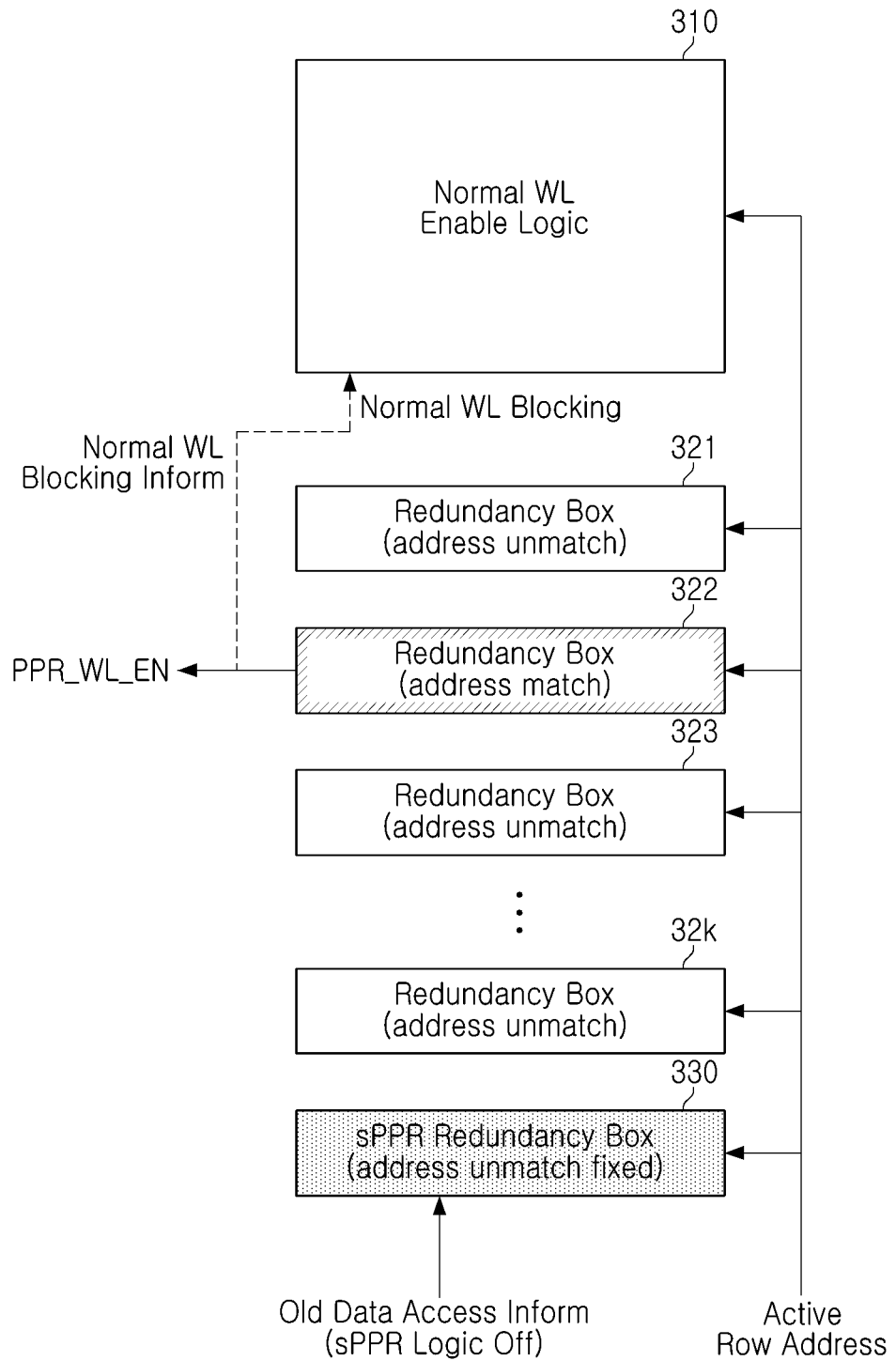

FIGS. 8A and 8B are diagrams conceptually illustrating an operation of a wordline activation logic of a memory device 100 according to an example embodiment.

In FIG. 8A, it may be assumed that two redundancy boxes 322 and 330 to which an address matching operation is performed when an activated row address is received in the memory device 100 are present. A sPPR redundancy box 330 may compare a received active row address with a stored row address, and when the address matching operation is performed as a result of the comparison, the sPPR redundancy box 330 may output an sPPR wordline activation signal sPPR_WL_EN. The sPPR wordline activation signal sPPR_WL_EN may be used as information for blocking a normal wordline and a repair wordline.

Redundancy boxes 321, 322, 323, . . . , 32k (where k is an integer equal to or greater than 2) may be inactivated by the sPPR wordline activation signal sPPR_WL_EN. Also, even though the address matching with an active row address is performed in the redundancy box 322, repair wordline activation may be inhibited by the sPPR wordline activation signal sPPR_WL_EN. Each of the redundancy boxes 321, 322, 323, . . . , 32k may include an hPPR-related repair wordline activation logic.

Also, a normal wordline activation logic 310 may be inactivated by the sPPR wordline activation signal sPPR_WL_EN. In other words, the normal wordline activation logic 310 may block a corresponding normal wordline in response to an active row address.

Referring to FIG. 8B, when old data access information is received in the memory device 100 after the sPPR repair operation, the sPPR redundancy box 330 may be inactivated. The old data access information may include information for turning off a sPPR logic. The sPPR redundancy box 330 may be fixed in an address unmatched state according to the old data access information. As the address matching with the active row address is performed in the redundancy box 322, the redundancy box 322 may output the sPPR wordline activation signal sPPR_WL_EN. A repair wordline corresponding to the active row address may be activated and old data may be output from memory cells connected to the repair wordline, in response to the sPPR wordline activation signal sPPR_WL_EN.

Figure 9:
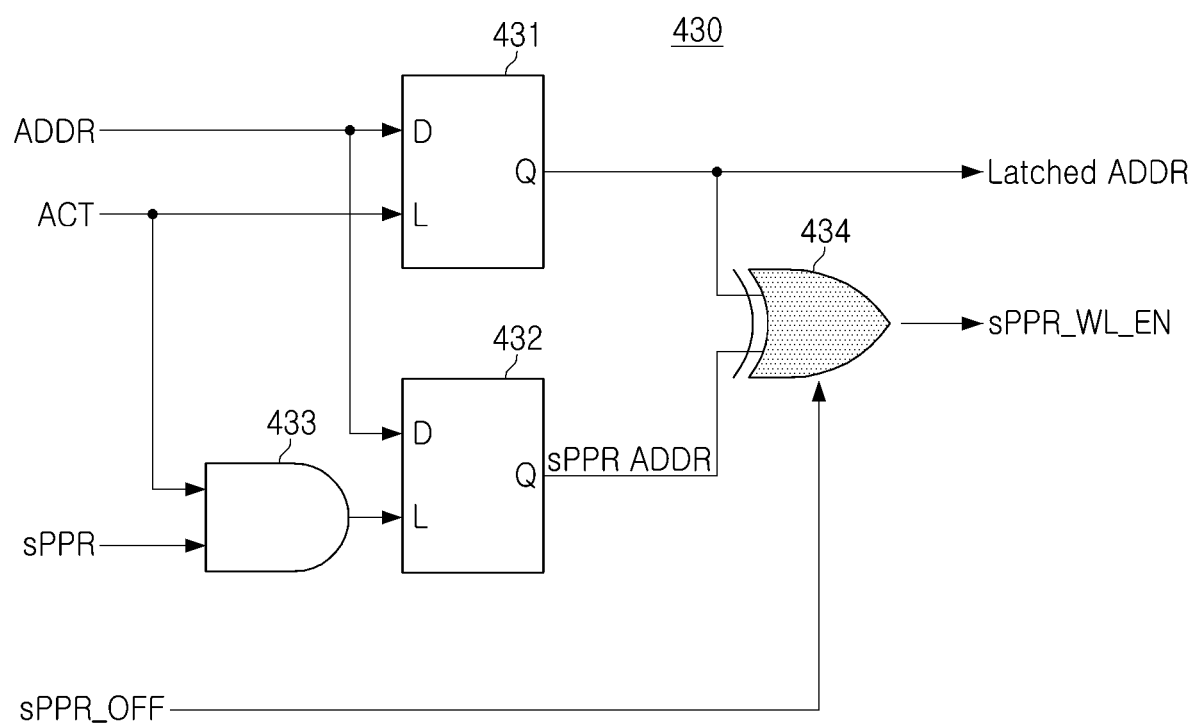
FIG. 9 is a schematic diagram illustrating an example of an sPPR logic according to an example embodiment.

FIG. 9 is a schematic diagram illustrating an example of an sPPR logic 430 according to an example embodiment. Referring to FIG. 9, an sPPR logic 430 may include a first latch 431, a second latch 432, a first logic circuit 433, and a second logic circuit 434.

The sPPR logic 430 may receive an address ADDR, an active signal ACT, an sPPR signal sPPR, and an sPPR off signal sPPR_OFF and may operate as below.

The first latch 431 may latch and output the address ADDR in response to an active signal ACT. The second latch 432 may latch and output the address ADDR in response to an output value of the first logic circuit 433. In an example embodiment, each of the first and second latches 431 and 432 may include a flip-flop.

The first logic circuit 433 may, by AND-calculating the active signal ACT and the sPPR signal sPPR, output a corresponding output value to the second latch 432.

The second logic circuit 434 may, by XOR-calculating the latched address of the first latch 431 and the latched address of the second latch 432, output an sPPR wordline activation signal sPPR_WL_EN. The latched address of the second latch 432 may be an sPPR address. Also, the second logic circuit 434 may be inactivated in response to the sPPR off signal sPPR_OFF.

Figure 10:
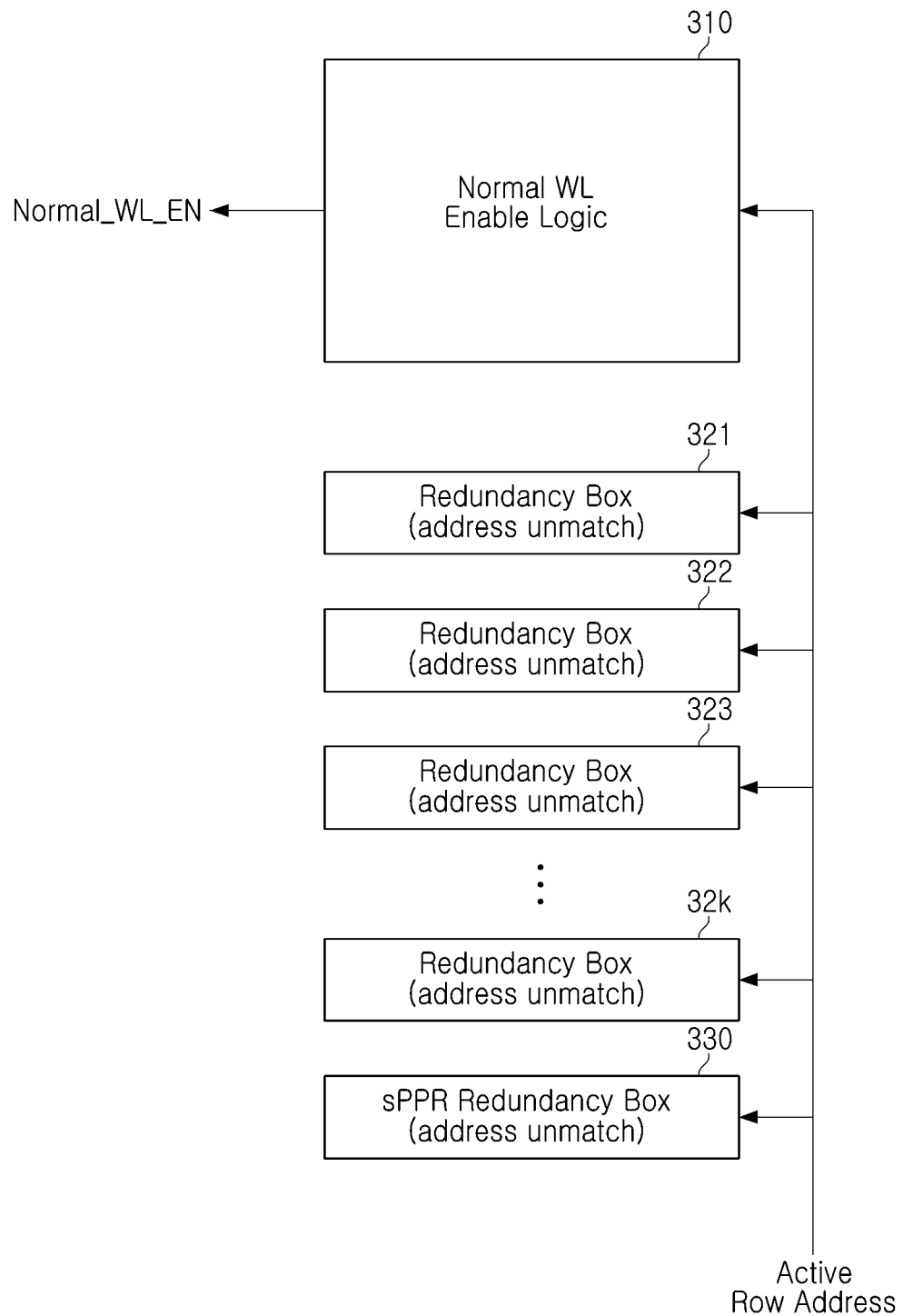
FIG. 10 is a diagram illustrating an example of a normal wordline activation operation of a memory device according to an example embodiment.

FIG. 10 is a diagram illustrating an example of a normal wordline activation operation of a memory device 100 according to an example embodiment. Referring to FIG. 10, when a row address applied when an active command is received is an address which may not be repaired (e.g., not need repairing), as no address matching operation is performed in redundancy boxes 321 to 32k and an sPPR redundancy box 330, a normal wordline activation logic 310 may output a normal wordline activation signal Normal_WL_EN.

Figure 11:
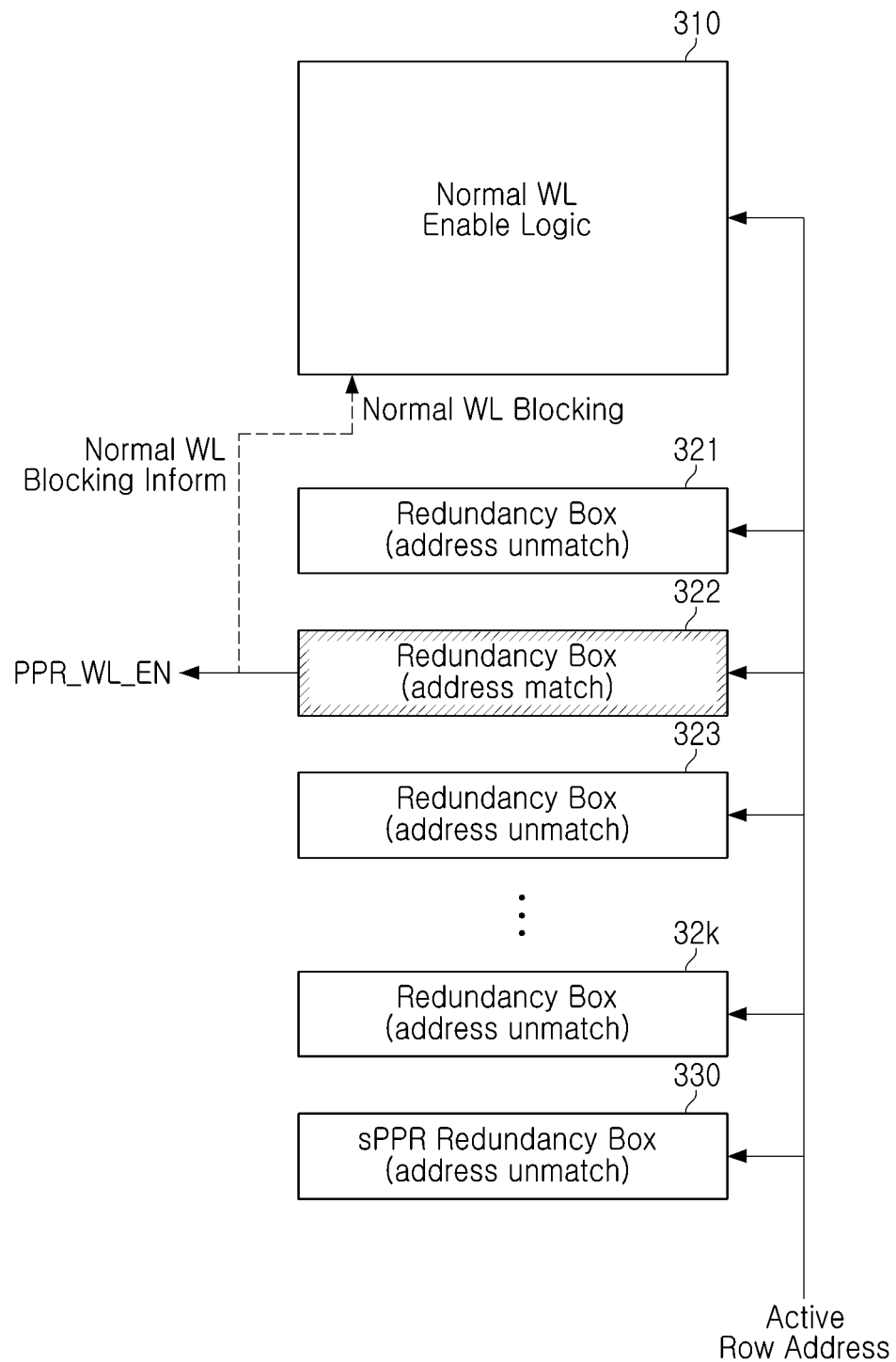
FIG. 11 is a diagram illustrating an example of a repair wordline activation operation of a memory device according to an example embodiment.

FIG. 11 is a diagram illustrating an example of a repair wordline activation operation of a memory device 100 according to an example embodiment. Referring to FIG. 11, when a row address, applied at the time when an active command is received, commands a repaired wordline, a redundancy box 322 may output a repair wordline activation signal PPR_WL_EN for activating a repair wordline according to (e.g., in response to) the address matching. The redundancy box 322 may inhibit activation of a normal wordline by blocking the normal wordline activation logic 310 using generated address match information.

Figure 12:
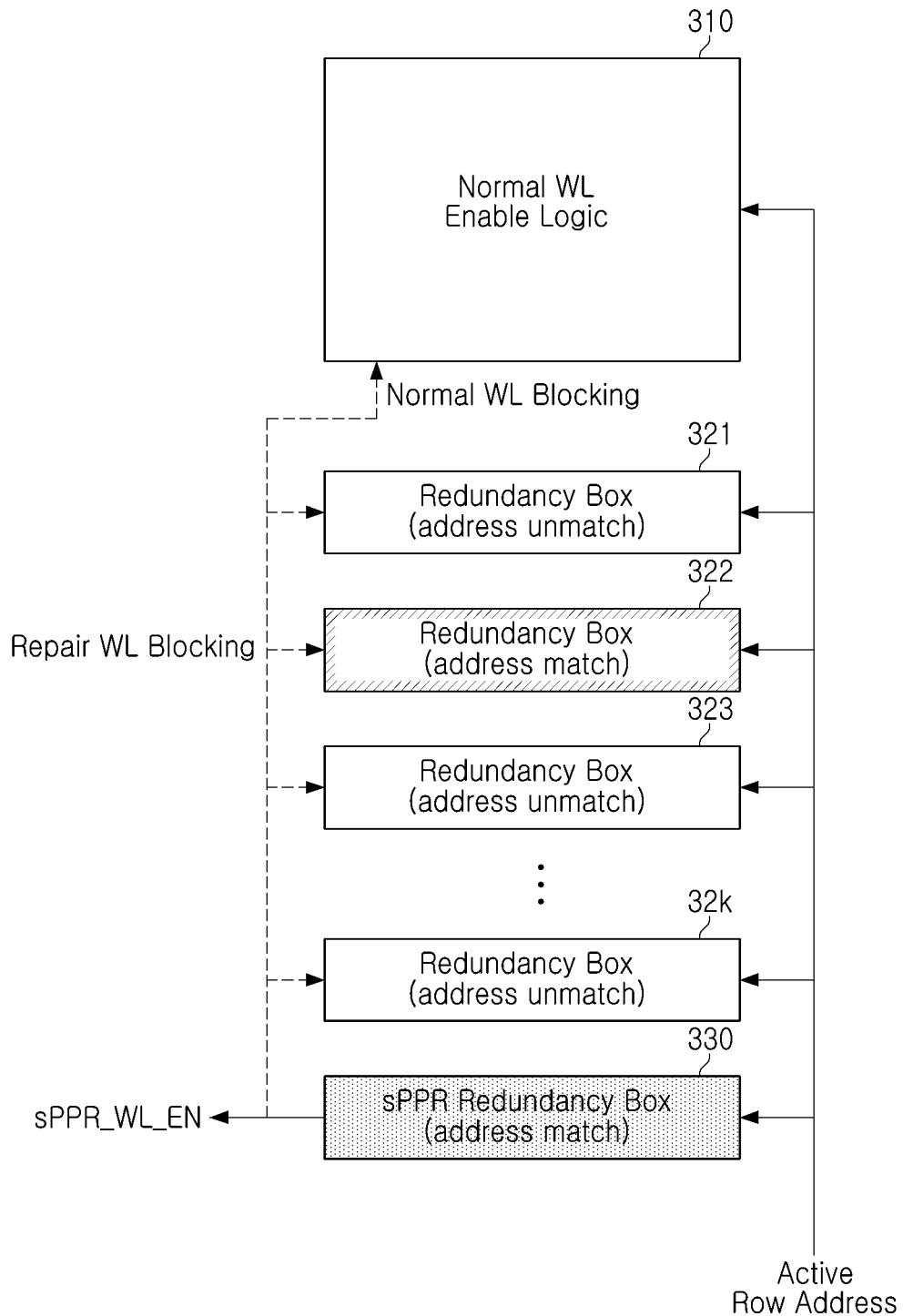
FIG. 12 is a diagram illustrating an example of an sPPR wordline activation operation of a memory device according to an example embodiment.

FIG. 12 is a diagram illustrating an example of an sPPR wordline activation operation of a memory device 100 according to an example embodiment. Referring to FIG. 12, when a failed cell is generated in a repaired wordline and an sPPR is performed to a corresponding wordline, an address matching operation may be performed in the redundancy box 322 and the sPPR redundancy box 330. The redundancy box 322 may output an sPPR wordline activation signal sPPR_WL_EN corresponding to address match information. As the sPPR wordline activation signal sPPR_WL_EN blocks existing redundancy boxes 321 to 32k and a wordline activation logic 310, the sPPR wordline activation signal sPPR_WL_EN may be prevented from being activated in wordlines other than a wordline corresponding to the sPPR redundancy box 330.

Figure 13:
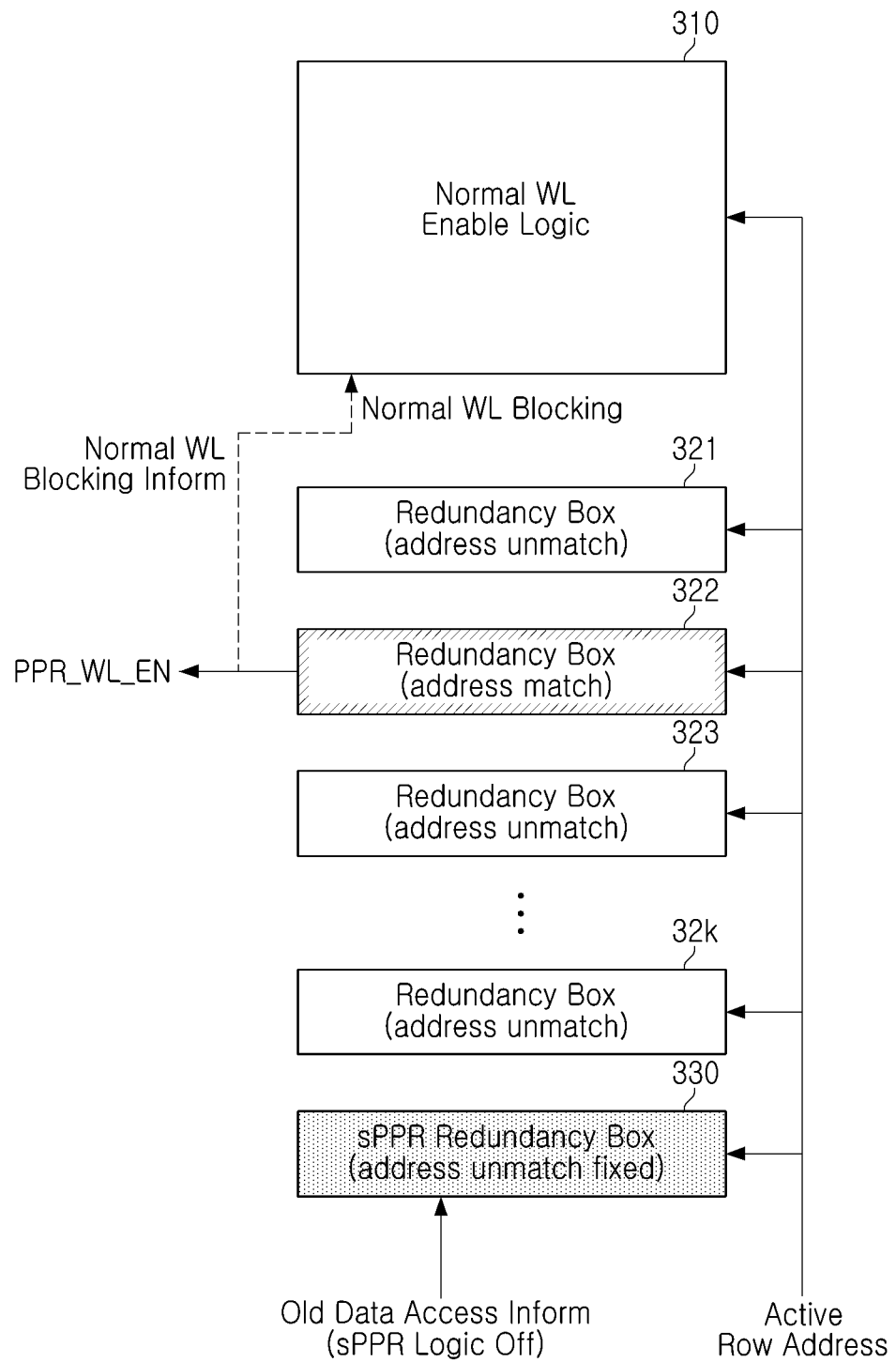
FIG. 13 is a diagram illustrating an example of an operation of accessing old data after an sPPR of a memory device according to an example embodiment.

FIG. 13 is a diagram illustrating an example of an operation of accessing old data after an sPPR of a memory device 100 according to an example embodiment. Before an sPPR is performed, the sPPR may be performed after all data of a corresponding row address to another address. However, generally, as a signal wordline is connected to 8 K or more cells, there may be no sufficient spare space depending on a use situation of a DRAM. In this case, a copying operation may not be available.

The memory device 100 according to the example embodiment may access data to which the sPPR has not yet been performed after performing the sPPR as illustrated in FIG. 13. For example, as the sPPR redundancy box 330 receiving data access information is address-unmatched forcibly, the redundancy box 322 may output a repair wordline activation signal PPR_WL_EN for activating the existing repair wordline according to the address matching.

The memory device 100 according to the example embodiment may access old data at a necessary time point while the memory device 100 operates even after the sPPR has been performed such that there may be no data loss. By turning off an address match logic of an sPPR redundancy box after the sPPR, a wordline WL prior to the sPPR may be enabled when a respective address is active. To this end, as indicated by the portion marked "old data access inform" in FIG. 13, information indicating an access to old data prior to the sPPR may be necessary. For example, as the old data access information, old data access information defined by a mode register set (MRS) may be used. By enabling a wordline prior to or after the sPPR according to corresponding information, a data loss issue caused by the sPPR may be addressed.

In FIG. 13, it may be assumed that a row address to which the sPPR is performed may be a repaired address for ease of description. However, the address to which the sPPR is performed may not be limited thereto. The address to which the sPPR is performed may be a normal address.

Figure 14:
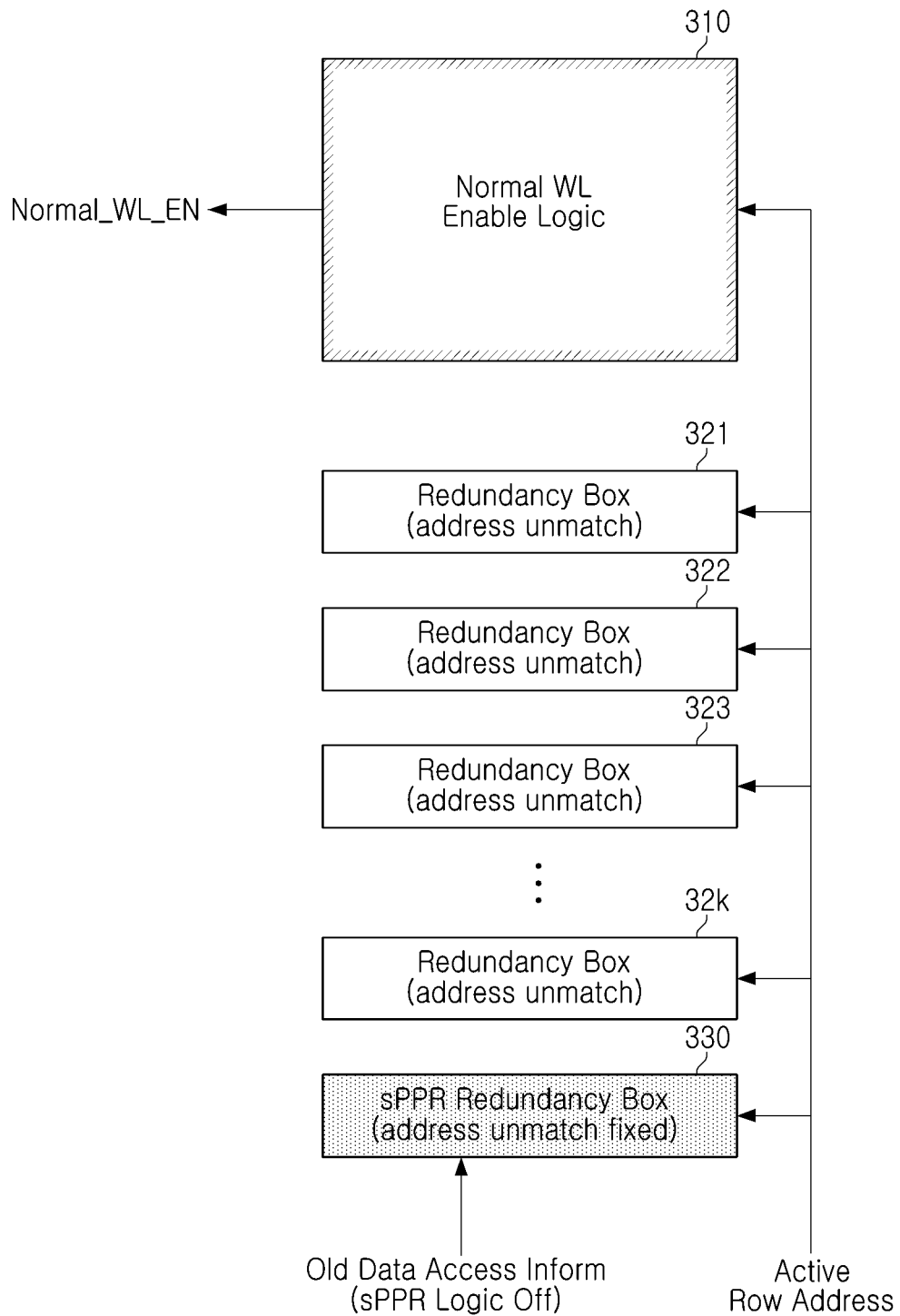
FIG. 14 is a diagram illustrating an example of an operation of accessing old data after an sPPR of a memory device according to another example embodiment.

FIG. 14 is a diagram illustrating an example of an operation of accessing old data of a memory device 100 after an sPPR according to another example embodiment.

As illustrated in FIG. 14, an address to which an sPPR is performed may command a wordline which has not been repaired. Accordingly, old data may be output by a normal wordline activation logic 310 in response to a normal wordline activation signal Normal_WL_EN. The memory device 100 according to the example embodiment may, by implementation of an sPPR circuit and a method thereof, access a wordline WL to which the sPPR has not been performed even after the sPPR is performed, regardless of whether the existing WL has been repaired or not, and accordingly, data loss may be inhibited/prevented.

Figure 15:
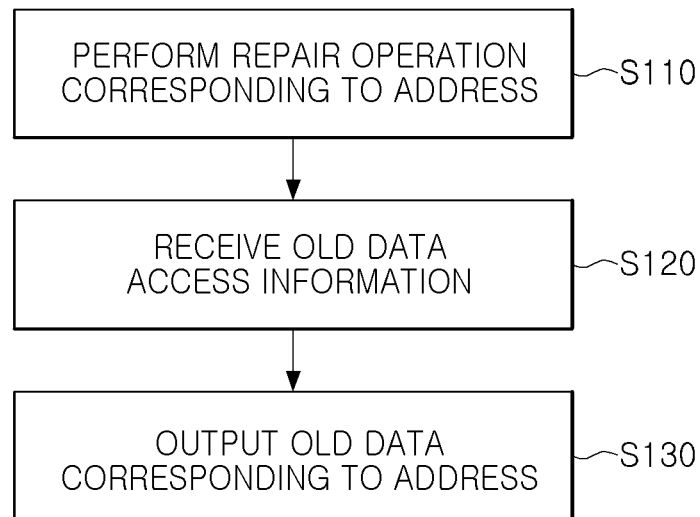
FIG. 15 is a flowchart illustrating an example of an operating method of a memory device according to an example embodiment.

FIG. 15 is a flowchart illustrating an example of an operating method of a memory device 100 according to an example embodiment. Referring to FIGS. 1 to 15, the memory device 100 may operate as below.

The memory device 100 may perform a repair operation corresponding to an address in response to an external request (S110). The repair operation may include a soft post package repair (sPPR). The memory device 100 may receive old data access information from an external entity, and may access old data corresponding to the address according to the received old data access information (S120). In this case, an sPPR logic may be inactivated according to (e.g., in response to) the old data access information. Accordingly, old data may be read from memory cells connected to the address. Thereafter, the memory device 100 may externally output the old data corresponding to the address (S130).

The memory device 100 according to the example embodiment may access old data to which the sPPR has not been performed even after the sPPR is performed.

In an example embodiment, when the sPPR is performed with respect to a cell or a row in which a defect has occurred, existing repair information of the respective cell or row may be maintained without change. In an example embodiment, when an access to the cell to which the sPPR has been performed is performed, an access to the cell to which the sPPR has been performed may be performed more preferentially than an access to a normal cell or a cell which has been repaired. For example, the repair control circuit 166 and/or the controller 200 may prioritize performing the sPPR over performing the hPPR (e.g., a predetermined threshold for performing the sPPR may be lower). In an example embodiment, information to which the sPPR has been performed may be blocked from access to the cell which has not been repaired through the sPPR, and the cell to which the sPPR has not been performed may be accessed. In an example embodiment, when the sPPR is performed to a cell which has not been repaired in a process of manufacturing a semiconductor, even after the sPPR is performed, a cell which has no history of being repaired and to which the sPPR has not been performed may be accessed. In an example embodiment, when the sPPR is performed to a cell having a history of being repaired in the process of manufacturing a semiconductor, a cell which has a history of being repaired and to which the sPPR has not been performed may be accessed using an MRS even after the sPPR has been performed.

Figure 16:
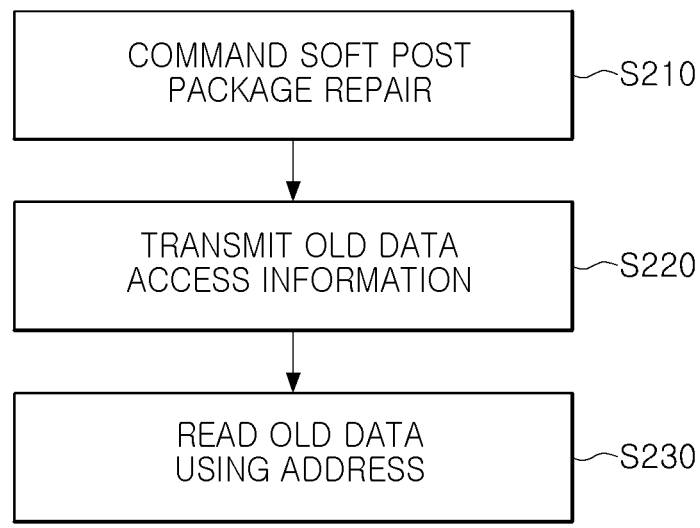
FIG. 16 is a flowchart illustrating an example of an operating method of a controller according to an example embodiment.

FIG. 16 is a flowchart illustrating an example of an operating method of a controller 200 according to an example embodiment. Referring to FIGS. 1 to 16, an operation method of a controller 200 may be as below. The controller 200 may perform a read operation to the memory device 100, and may determine whether a soft post package repair (sPPR) is desirable/necessary according to a result of the performing a read operation. When the sPPR is desirable/necessary as a result of the determination, the controller 200 may transmit an sPPR command to the memory device 100 along with a corresponding address (S210). Thereafter, the controller 200 may transmit old data access information corresponding to the address to the memory device 100 if desirable/necessary (S220). For example, when it is desirable/necessary to copy old data to memory cells connected to a wordline corresponding to a repair address, the controller 200 may transmit the old data access information to the memory device 100. Thereafter, the controller 200 may access to the memory device 100 using the address, thereby reading the old data (S230).

Figure 17:
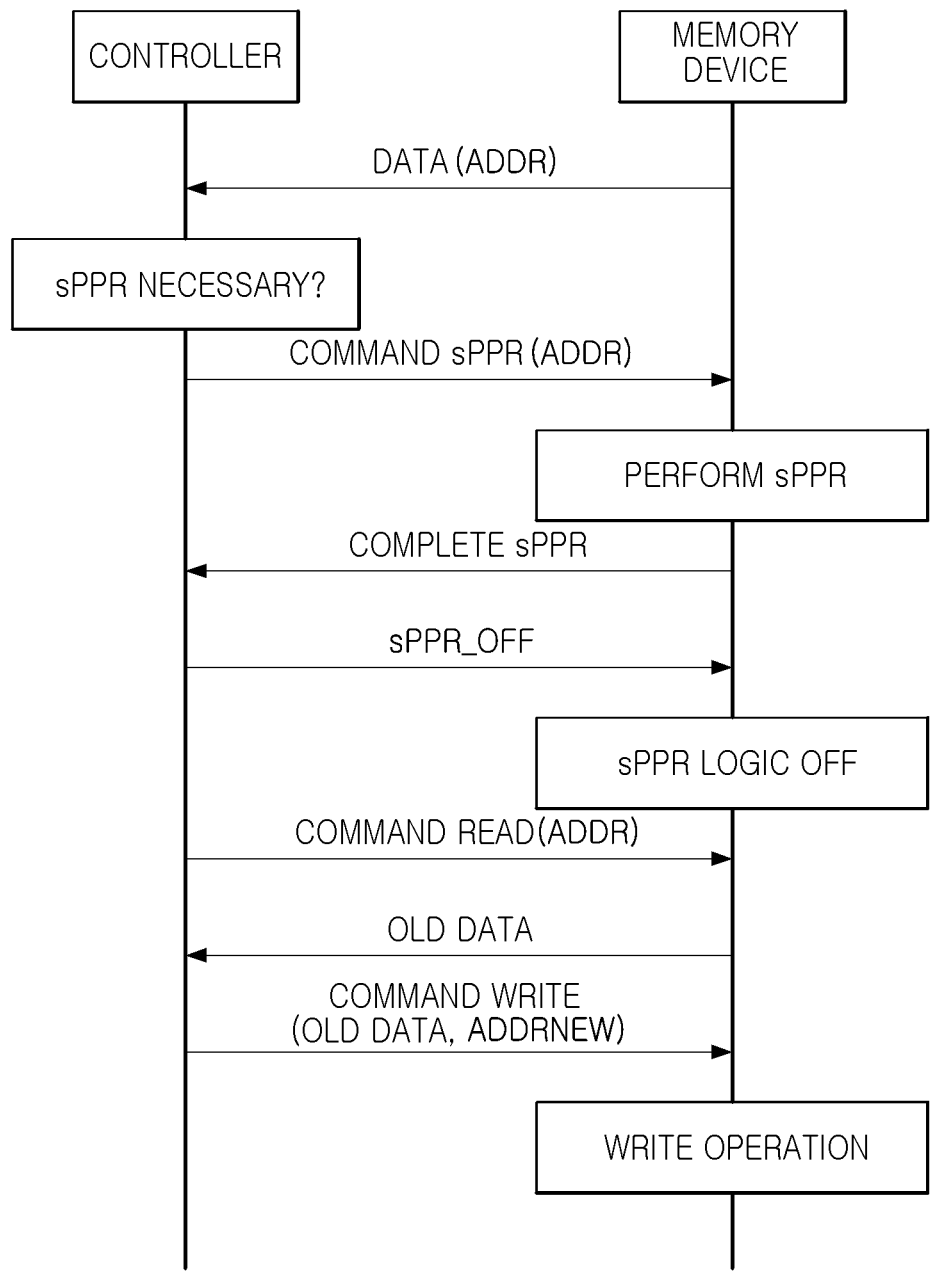
FIG. 17 is a ladder diagram illustrating an example of a repair operation of a memory system according to an example embodiment.

FIG. 17 is a ladder diagram illustrating an example of a repair operation of a memory system 10 according to an example embodiment. Referring to FIGS. 1 to 17, a repair operation of the memory system 10 may be performed as described below.

The controller 200 may receive data corresponding to an address ADDR from the memory device 100. The address ADDR may be a normal address or an hPPR address. The controller 200 may perform error correction with respect to the received data. When the number of errors is equal to or higher than a reference value as a result of the error correction, the controller 200 may determine that an sPPR is desirable/necessary for a corresponding address. When the sPPR is desirable/necessary for the address ADDR, the controller 200 may transmit an sPPR command to the memory device 100. The memory device 100 may perform the sPPR in response to the sPPR command, and may transmit a response message for completion of the sPPR to the controller 200.

Thereafter, the controller 200 may request the memory device 100 to set an sPPR_OFF mode to read old data from memory cells connected to a wordline corresponding to the address ADDR. For example, the controller 200 may read old data to copy the old data to memory cells connected to an sPPR wordline. The memory device 100 may turn off an sPPR logic according to an sPPR_OFF request. Thereafter, the controller 200 may transmit a read command to the memory device 100 along with the address ADDR. The memory device 100 may read old data from the memory cells connected to the wordline corresponding to the address ADDR in the sPPR_OFF in response to a read command mode, and may transmit the read old data to the controller 200.

The controller 200 may transmit a write command to the memory device 100 along with the received old data such that the received old data may be written on memory cells connected to a new wordline, the sPPR wordline. The memory device 100 may write the old data on the memory cells connected to the sPPR wordline in response to the write command. Accordingly, the old data may be copied to the new wordline.

In FIG. 17, the transmission of the sPPR command and the request of the sPPR_OFF may be performed separately. However, an example embodiment thereof is not limited thereto. The transmission of the sPPR command and the request of the sPPR_OFF may be performed simultaneously depending on a situation of a system 100.

Figure 18:
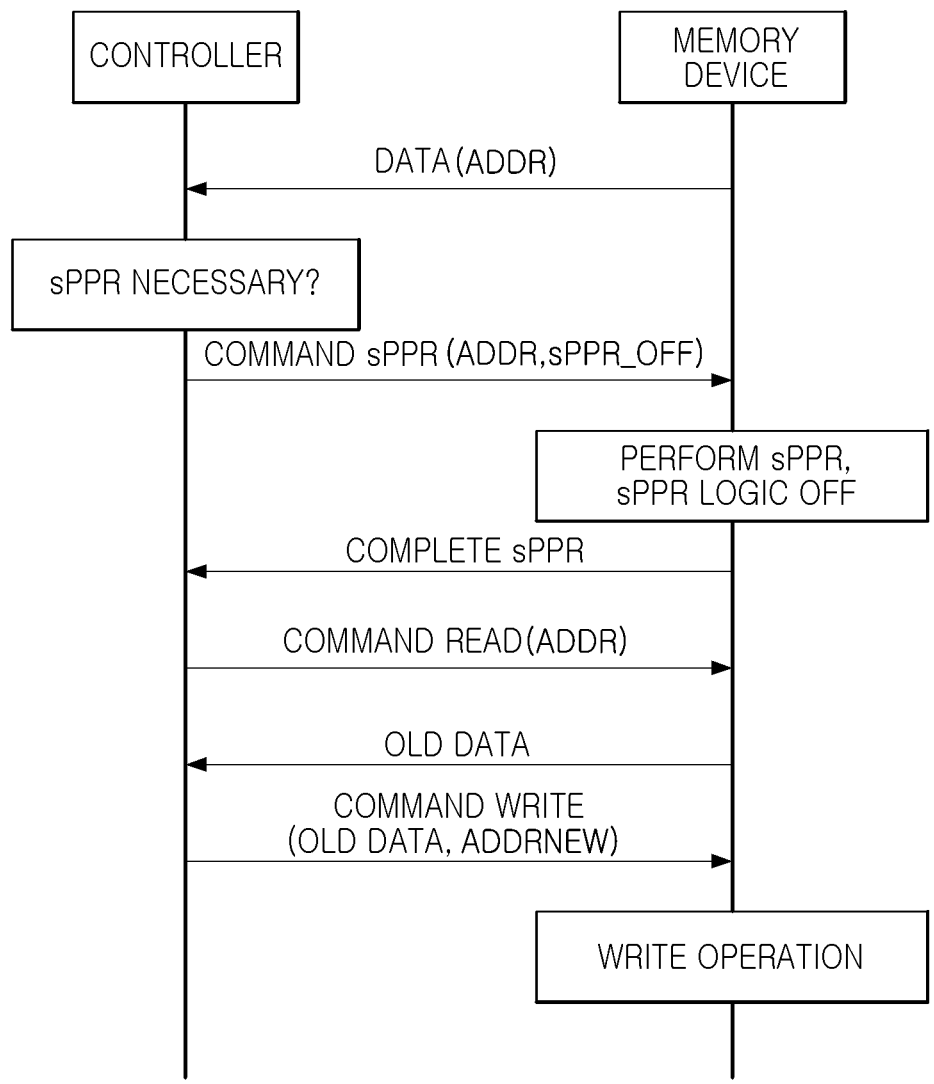
FIG. 18 is a ladder diagram illustrating an example of a repair operation of a memory system according to another example embodiment.

FIG. 18 is a ladder diagram illustrating an example of a repair operation of a memory system 10 according to another example embodiment. A repair operation of the memory system 10 in FIG. 18 may be different from the repair operation illustrated in FIG. 17 in that the sPPR_OFF request and the sPPR command may be simultaneously transmitted to the memory device 100 in FIG. 18.

The memory device according to the example embodiment may be implemented as a stack-type memory device.

Figure 19:
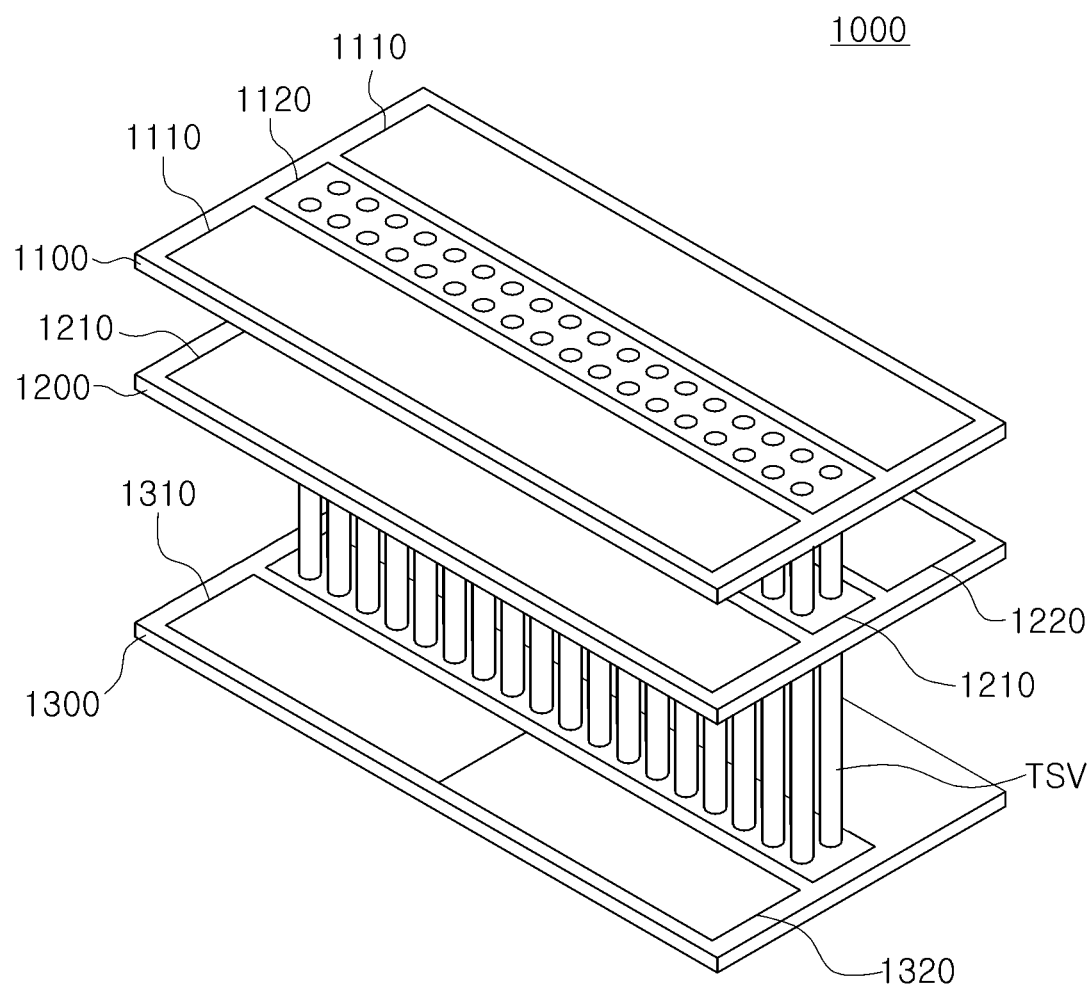
FIG. 19 is a block diagram illustrating an example of a memory chip according to an example embodiment.

FIG. 19 is a block diagram illustrating an example of a memory chip according to an example embodiment. Referring to FIG. 19, a memory chip 1000 may include first to third memory dies 1100 to 1300 stacked in a direction perpendicular to a substrate, and through-electrodes, through silicon vias (TSV). The number of stacked memory dies may not be limited to the example illustrated in FIG. 19. For example, the first and second memory dies 1100 and 1200 may be slave dies, and the third memory die 1300 may be a master die or a buffer die.

The first memory die 1100 may include a first memory cell array 1110 and a first through-silicon-via region 1120 for an access to the first memory cell array 1110. The second memory die 1200 may include a second memory cell array 1210 and a second through-silicon-via region 1220 for an access to the second memory cell array 1210. The first through-silicon-via region 1120 may refer to a region of the first memory die 1100 in which through silicon vias for communication between the first memory die 1100 and the third memory die 1300 are disposed. Similarly, the second through-silicon-via region 1220 may refer to a region of the second memory die 1200 in which through silicon vias for communication between the second memory die 1200 and the third memory die 1300 are disposed. The through silicon vias may provide electrical paths among the first to third memory dies 1100 to 1300.

The first to third memory dies 1100 to 1300 may be connected to one another through the through silicon vias. For example, the number of the through silicon vias may be several hundreds to several thousands, and the through silicon vias may be disposed in matrix arrangement. The third memory die 1300 may include a first peripheral circuit 1310 and a second peripheral circuit 1320. The first peripheral circuit 1310 may include circuits for accessing the first memory die 1100, and the second peripheral circuit 1320 may include circuits for accessing the second memory die 1200. In an example embodiment, each of the peripheral circuit 1310 and 1320 may be implemented by a method and a device for performing the sPPR operation and the sPPR_OFF described in the aforementioned example embodiments with reference to FIGS. 1 to 18.

The memory device 100 according to the example embodiment may be applicable to a computing system.

Figure 20:
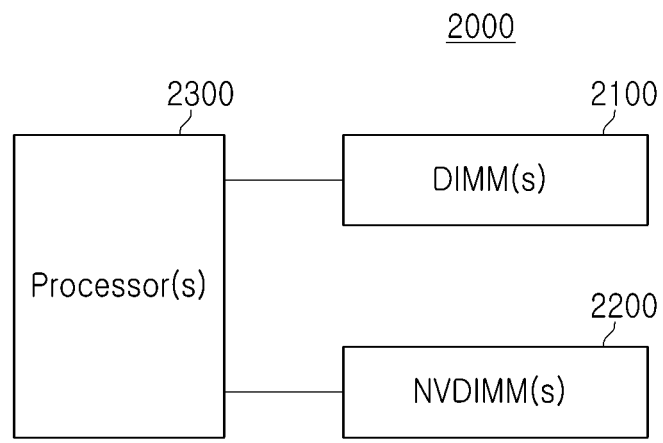
FIG. 20 is a diagram illustrating an example of a computing system according to an example embodiment.

FIG. 20 is a diagram illustrating an example of a computing system 2000 according to an example embodiment. Referring to FIG. 20, the computing system 2000 may include at least one volatile memory module(s) (DIMM(s)) 2100, at least one non-volatile memory module(s) (NVDIMM(s)) 2200, and at least one central processing unit(s) (CPU(s)) 2300.

The computing system 2000 may be implemented by a computer, a portable computer, a ultra mobile PC (UMPC), a workstation, a data server, a netbook, a personal digital assistant (PDA), a tablet, a wireless phone, a mobile phone, a smartphone, an electronic book, a portable multimedia player (PMP), a digital camera, a digital audio recorder/player, a digital camera/video recorder/player, a portable game machine, a navigation system, a wearable device, a 3D television, a device for receiving and transmitting information in a wireless environment, one of various electronic devices included in a home network, one of various electronic devices included in a computer network, one of various electronic devices included in a telematics network, a radio frequency identification (RFID), or one of various electronic devices included in a computing system.

The at least one non-volatile memory module(s) 2200 may include at least one non-volatile memory. In an example embodiment, the at least one non-volatile memory module(s) may include a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), a thyristor random access memory (TRAM), or the like.

In an example embodiment, at least one of the memory modules 2100 and 2200 may be implemented to perform the hPPR, sPPR, and sPPR_OFF operations described in the aforementioned example embodiments with reference to FIGS. 1 to 18.

In an example embodiment, the memory modules 2100 and 2200 may be connected to a processor 2300 according to a DDRx (x is an integer equal to or greater than 1) interface.

The at least one central processing unit(s) 2300 may be implemented to control the volatile memory module(s) 2100 and the non-volatile memory module(s) 2200. In an example embodiment, the processor 2300 may include a general purpose microprocessor, a multi-core processor, a digital signal processor (DSP), an application specific integrated circuit (ASIC), or combinations thereof.

The memory device 100 according to the example embodiment may be applicable to an automotive system.

Figure 21:
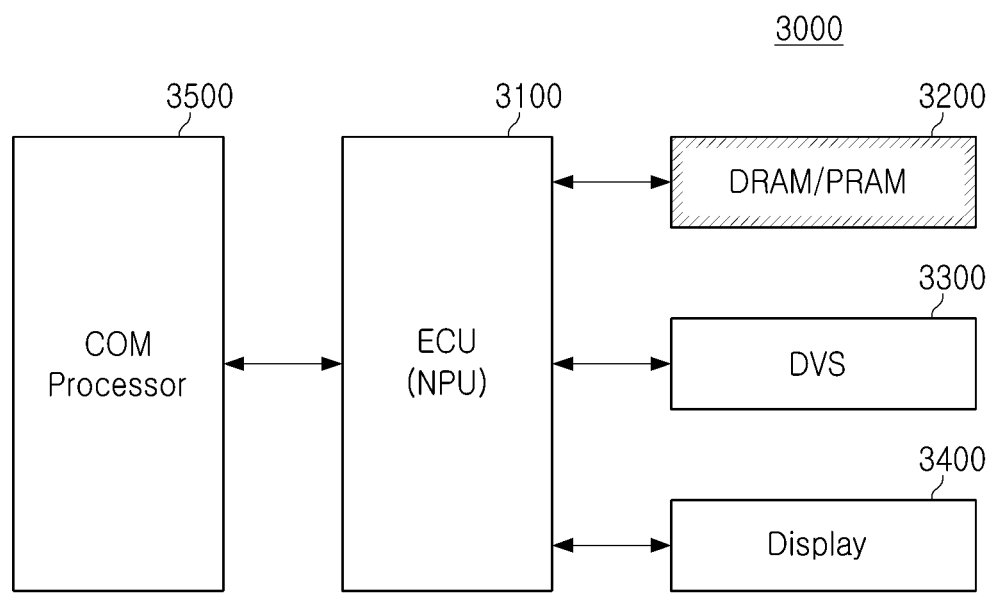
FIG. 21 is a diagram illustrating an example of an electronic system used for a vehicle according to an example embodiment.

FIG. 21 is a diagram illustrating an example of an electronic system 3000 used for a vehicle according to an example embodiment. Referring to FIG. 21, the electronic system 3000 may include an electronic control unit (ECU) 3100, a memory device 3200, a dynamic range sensor (DVS) 3300, a display 3400, and a communication (COM) processor 3500.

The ECU 3100 may be implemented to control overall operations. The ECU 3100 may process image data received from the DVS 3300. The ECU 3100 may include a neural processing unit (NPU). The NPU may swiftly derive an image optimized for driving by comparing the image received from the DVS 3300 with a learning model.

The memory device 3200 may be implemented to store a learning model related to operations of the NPU. The memory device 3200 may include a volatile memory or a non-volatile memory. For example, the memory device 3200 may be implemented by a DRAM or a PRAM. Also, the memory device 3200 may perform operations of the hPPR mode, the sPPR mode, and the sPPR_OFF mode, as illustrated in FIGS. 1 to 18. As an access to old data may be available even after an sPPR operation, the memory device 3200 may perform a repair operation in real time and may also improve data reliability.

The DVS 3300 may be implemented to sense an external environment of a vehicle. The DVS 3300 may output an event signal in response to changes in relative intensity of light. The DVS 3300 may include a pixel array including a plurality of DVS pixels, and address event processors.

The display 3400 may be implemented to display an image processed in the ECU 3100 or an image transmitted by the communication processor 3500.

The communication processor 3500 may be implemented to transmit the processed image to an external device, such as an external vehicle, for example, or to receive an image from an external vehicle. Accordingly, the communication processor 3500 may be implemented to perform wired or wireless communications with an external device.

The example embodiment may also be applied to a mobile device.

Figure 22:
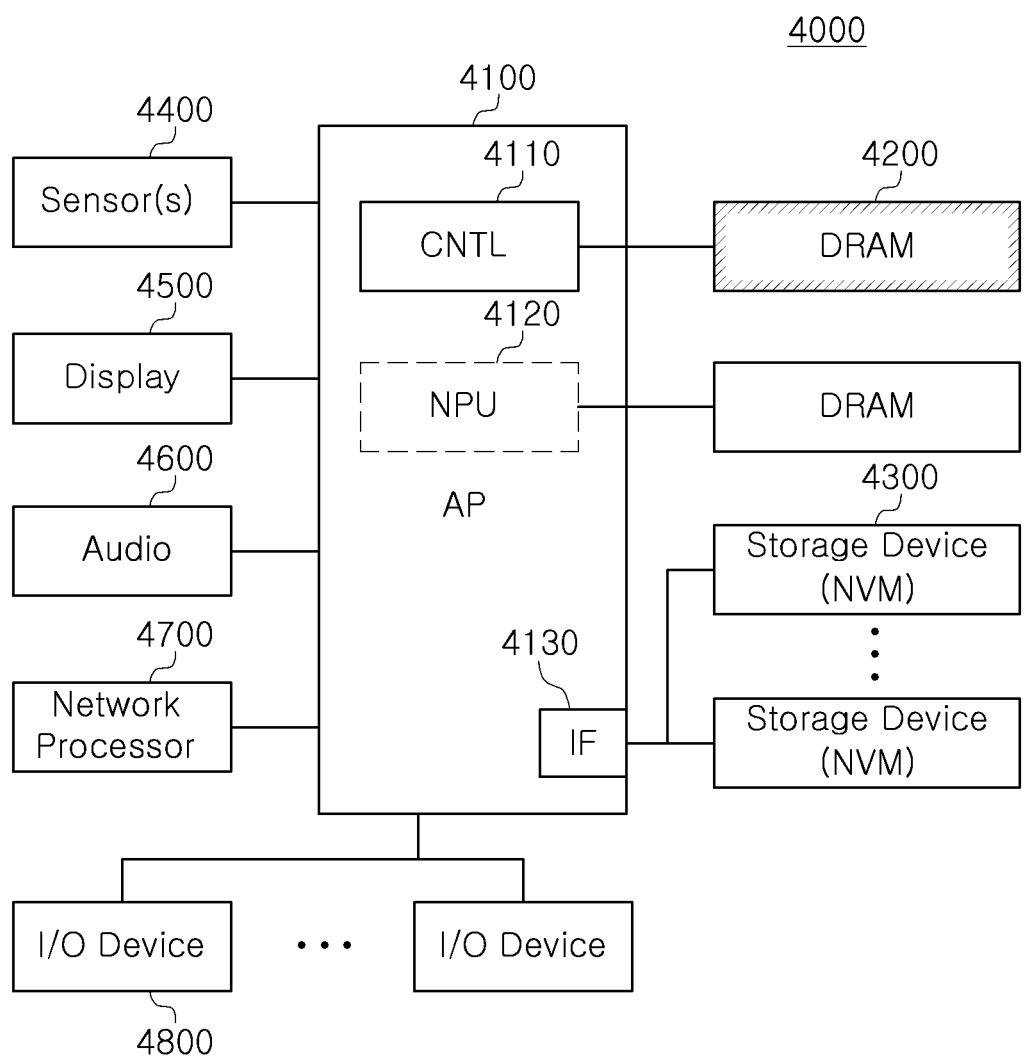
FIG. 22 is a diagram illustrating an example of a mobile device according to an example embodiment.

FIG. 22 is a diagram illustrating an example of a mobile device 4000 according to an example embodiment. Referring to FIG. 22, the mobile device 4000 may include an application processor 4100, at least one DRAM 4200, at least one storage device 4300, at least one sensor 4400, a display device 4500, an audio device 4600, a network processor 4700, and at least one input and output device 4800. For example, the mobile device 4000 may be implemented by a laptop computer, a mobile phone, a smartphone, a tablet personal computer, or a wearable computer.

The application processor 4100 may be implemented to control overall operations of the mobile device 4000. The application processor 4100 may execute applications providing an internet browser, a game, a video, and the like. In an example embodiment, the application processor 4100 may include a single core or multi-cores. For example, the application processor 4100 may include multi-cores such as dual-cores, quad-cores, hexa-cores, or the like. In an example embodiment, the application processor 4100 may further include a cache memory disposed in the application processor 4100 or externally of the application processor 4100.

The application processor 4100 may include a control (CNTL) device 4110, a neural processing unit (NPU) (artificial intelligence processor) 4120, and an interface (IF) 4130. In an example embodiment, the NPU 4120 may be provided optionally.

In an example embodiment, the application processor 4100 may be implemented as a system-on-chip (SoC). A kernel of an operating system driven in an system-on-chip (SoC) may include a device driver for controlling an input and output scheduler (I/O Scheduler) and the storage device 4300. The device driver may control an access performance of the storage device 4300 by referring to the number of synchronization queues managed in the input and output scheduler, or may control a CPU mode, a DVFS level, and the like, in the SoC.

The DRAM 4200 may be connected to the control device 4110. The DRAM 4200 may store data required for operating the application processor 4100. For example, the DRAM 4200 may temporarily store an operating system (OS) and application data, or may be used as an execution space of various software codes.

The DRAM 4200 may perform an sPPR off operation according to a request of the application processor 4100. The DRAM 4200 may be connected to the NPU 4120. The DRAM 4200 may store data related to an artificial intelligence calculation.

The DRAM 4200 may have latency and bandwidth (BW) relatively faster than those of an I/O device of a flash memory. The DRAM 4200 may be defaulted when mobile power is turned on, and an OS and application data may be loaded to the DRAM 4200 and the DRAM 4200 may be used as a temporary storage space of an OS and application data, or may be used as an execution space of various software codes. A mobile system may perform a multitasking operation for simultaneously loading several applications, and conversion between applications and an execution speed thereof may be used as a performance index of the mobile system.

The storage device 4300 may be connected to the interface 4130. In an example embodiment, the interface 4130 may operate by one of communication protocols such as a DDR, a DDR2, a DDR3, a DDR4, a low power DDR (LPDDR), a universal serial bus (USB), a multimedia card (MMC), an embedded MMC, a peripheral component interconnection (PCI), a non-volatile memory express (NVMe), a peripheral component interconnect express (PCIe), a serial at attachment (SATA), a small computer system interface (SCSI), a serial attached SCSI (SAS), a universal storage bus (USB) attached SCSI (UAS), an internet small computer system interface (iSCSI), a fiber channel, and a fiber channel over Ethernet (FCoE). In an example embodiment, the one storage device 4300 may be included in the mobile device 4000 by being embedded therein. In another example embodiment, the one storage device 4300 may be included in the mobile device 4000 by being attached or detached thereto.

The storage device 4300 may be implemented to store user data. For example, the storage device 4300 may sore data collected from the sensor 4400, or may store network data, augmented reality (AR)/virtual reality (VR) data, and high definition (HD) 4K content. The storage device 4300 may include at least one non-volatile memory device. For example, the storage device 4300 may include a solid state driver (SSD), an embedded multimedia card (eMMC), or the like.

In an example embodiment, the storage device 4300 may be implemented as a separate chip in the application processor 4100, or may be implemented with the application processor 4100 in a single package.

In an example embodiment, the storage device 4300 may be mounted using various forms of packages. For example, the storage device 4300 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), wafer-level processed stack package (WSP), or the like.

The sensor 4300 may be implemented to sense an external environment of the mobile device 4000. In an example embodiment, the sensor 4300 may include an image sensor for sensing an image. In this case, the sensor 4300 may transmit generated image information to the application processor 4100. In another example embodiment, the sensor 4300 may include a bio-sensor for sensing biometric information. For example, the sensor 4300 may sense a fingerprint, an iris pattern, a vascular pattern, heart rates, blood sugar, and the like, and may generate sensing data corresponding to the sensed information. The sensor 4300, however, is not limited to an image sensor or a bio sensor. The sensor 4300 according to the example embodiment may include a temporary sensor such as a luminance sensor, an acoustic sensor, an acceleration sensor, and the like.

The display device 4500 may be implemented to output data. For example, the display device 4500 may output image data sensed using the sensor 4300, or may output data calculated using the application processor 4100.

The audio device 4600 may be implemented to externally output voice data, or to sense external voice.

The network processor 4700 may be implemented to connect communication with an external device by a wired or wireless communication method.

The input and output device 4800 may be implemented to input data to the mobile device 4000 or to output data from the mobile device 4000. The input and output device 4800 may include devices providing a digital input and output function such as a USB or a storage, a digital camera, an SD card, a touch screen, a DVD, a modem, a network adapter, and so on.

The example embodiment may be applicable to various types of computing systems (e.g., CPU/GPU/NPU platform).

Figure 23:
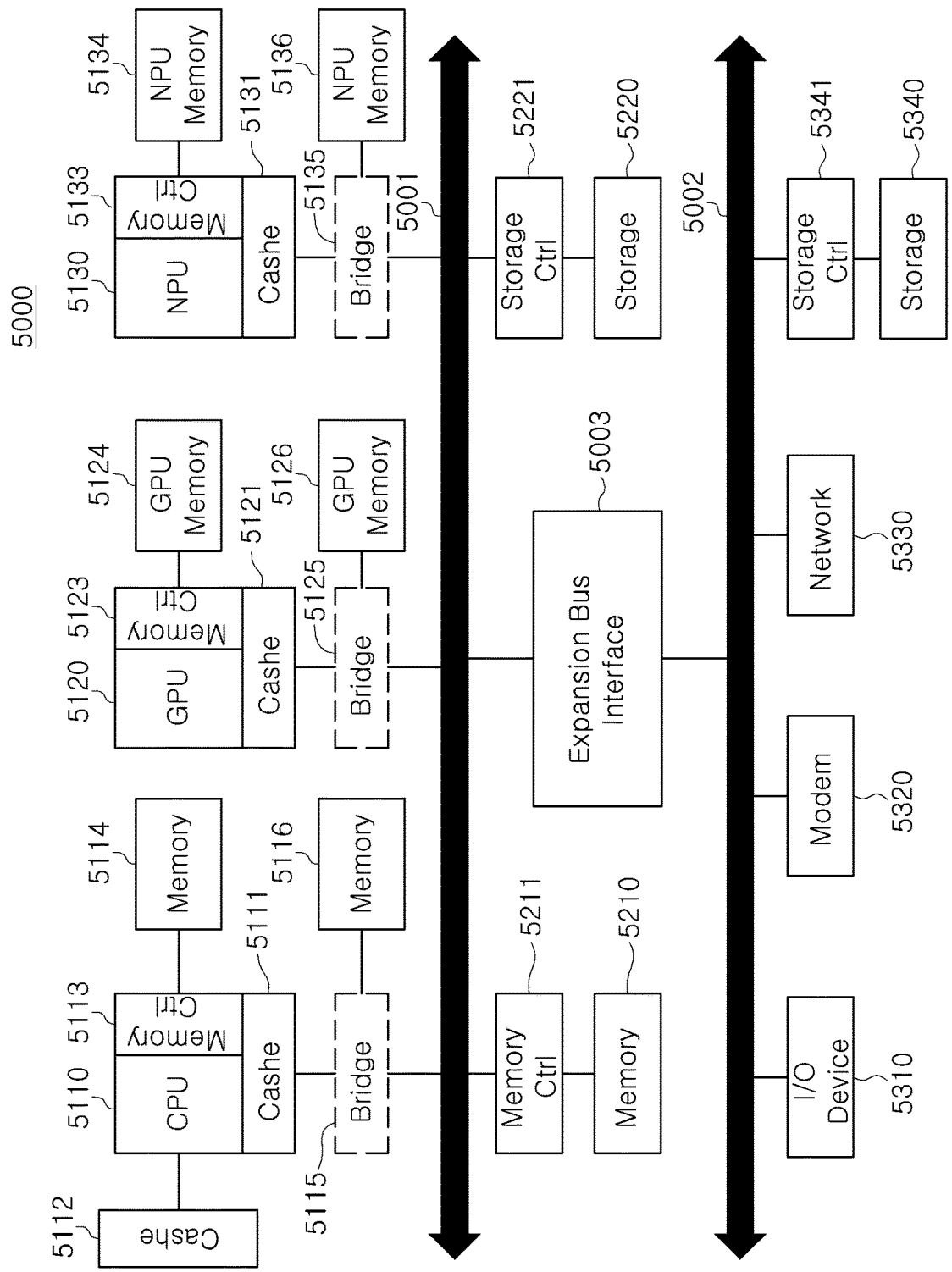
FIG. 23 is a diagram illustrating an example of a computing system according to an example embodiment.

FIG. 23 is a diagram illustrating an example of a computing system 5000 according to an example embodiment. Referring to FIG. 23, the computing system 5000 may include a central processing unit (CPU) 5110, a graphics processing unit (GPU) 5120, a neural processing unit (NPU) 5130, or an application-specific processing unit connected to a system bus 5001; a memory device 5210 or a storage device 5220 connected to the system bus 5001; and an input and output device 5310, a modem 5320, a network device 5330, a storage control 5341, or a storage device 5340 connected to an extension (e.g., expansion) bus 5002. The extension bus 5002 may be connected to the system bus 5001 through an extension bus interface 5003.

In an example embodiment, the CPU 5110, the GPU 5120, and the NPU 5130 may include on-chip caches 5111, 5121, and 5131, respectively.

In an example embodiment, the CPU 5110 may include an off-chip cache 5112.

Although not illustrated in FIG. 23, each of the GPU 5120 and the NPU 5130 may include an off-chip cache. In an example embodiment, the off-chip cache 5112 may be connected to internally of the CPU 5110, the GPU 5120, and the NPU 5130 through different buses.

In an example embodiment, the on-chip/off-chip cache may include a volatile memory such as a dynamic random access memory (DRAM), a static random access memory (SRAM), or the like, or a non-volatile memory such as a NAND flash memory, a phase random access memory (PRAM), a resistive random access memory (RRAM), or the like.

In an example embodiment, main memories 5114, 5124, and 5134 may be connected to the CPU 5110, the GPU 5120, and the NPU 5130 through corresponding memory control devices 5113, 5123, and 5133, respectively. In an example embodiment, memories 5116, 5126, and 5136 may be connected to the CPU 5110, the GPU 5120, and the NPU 5130 through bridges 5115, 5125, and 5135. The bridges 5115, 5125, and 5135 may include memory control devices for controlling the corresponding memories 5116, 5126, and 5136. In an example embodiment, each of the bridges 5115, 5125, and 5135 may be implemented as a network device, a wireless network device, a switch, a bus, a cloud, or an optical channel.

In an example embodiment, each of the memories 5124 and 5126 may include a GPU memory. The GPU memory may maintain a command and data interactive with the GPU. A command and data may be copied in a main memory or a storage. The GPU memory may store image data, and may have a bandwidth greater than that of the main memory. The GPU memory may divide a clock in the CPU. The GPU may read image data from the GPU memory and may process the data, and may write the data on the GPU memory. The GPU memory may be configured to accelerate graphics processing.

In an example embodiment, the memories 5134 and 5136 may include an NPU memory. The NPU memory may maintain a command and data interactive with the NPU. A command and data may be copied in a main memory or a storage. The NPU memory may maintain weight data in relation to a neural network. The NPU memory may have a bandwidth greater than that of the main memory. The NPU memory may divide a clock in the CPU. The NPU may read weight data from the NPU memory and may update the data, and may write the data on the NPU memory while training. The NPU memory may be configured to accelerate machine learning such as neural network learning or reasoning.

In an example embodiment, each of the main memories 5114, 5116, 5124, 5126, 5134, 5136, and 5210 may be implemented as a memory chip for performing the repair operation described in the aforementioned example embodiments with reference to FIGS. 1 to 18.

In an example embodiment, the main memory may include a volatile memory such as a DRAM, an SRAM, or the like, and a non-volatile memory such as a PRAM, an RRAM, or the like. The main memory may have latency and capacity lower than those of secondary storages 5210 and 5220.

The CPU 5110, the GPU 5120, or the NPU 5130 may access to the secondary storages 5210 and 5220 through the system bus 5001. The memory device 5210 may be controlled by a memory controller 5211. The memory controller 5211 may be connected to the system bus 5001. The storage device 5220 may be controlled by a storage controller 5221. The storage controller 5221 may be connected to the system bus 5001.

The storage device 5220 may be implemented to store data. The storage controller 5221 may be implemented to read data from the storage device 5220, and to transmit the read data to a host. The storage controller 5221 may be implemented to store the transmitted data in the storage device 5220 in response to a request of the host. Each of the storage device 5220 and the storage controller 5221 may include a buffer for storing meta data, reading a cache to store frequently accessed data, or storing a cache for increasing a writing efficiency. For example, a write cache may receive and process a certain number of write requests.

The storage device 5220 may include a volatile memory such as a hard disk drive (HDD), and a non-volatile memory such as an NVRAM, an SSD, a storage-class memory (SCM), and a new memory.

The example embodiment may be applicable to a data server system.

Figure 24:
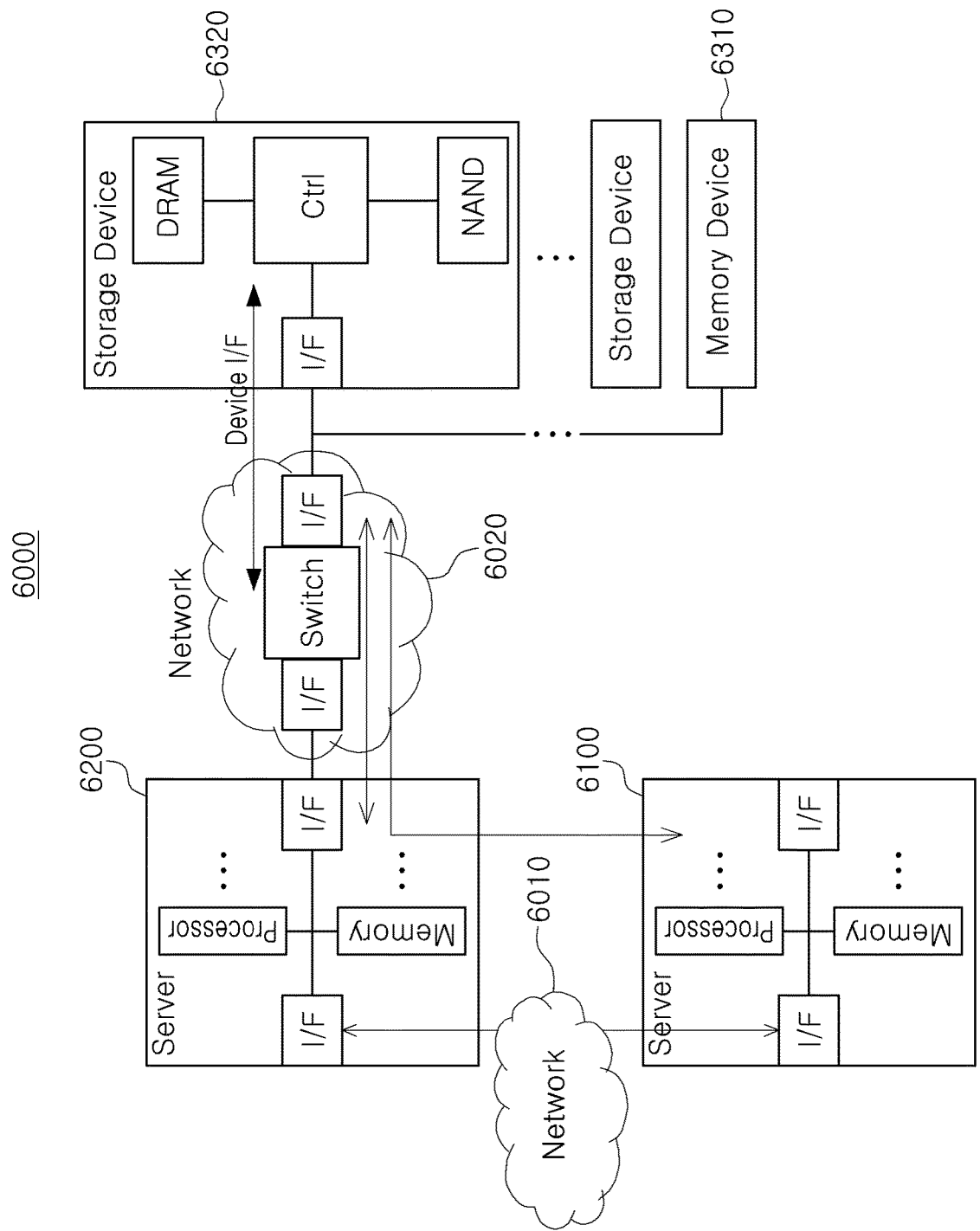
FIG. 24 is a diagram illustrating an example of a data server system according to an example embodiment.

FIG. 24 is a diagram illustrating an example of a data server system 6000 according to an example embodiment. Referring to FIG. 24, the data server system 6000 may include a first server 6100 (an application server), a second server 6200 (a storage server), a memory device 6310, and at least one storage device 6320.

Each of the first server 6100 and the second server 6200 may include at least one processor and one memory. In an example embodiment, each of the first server 6100 and the second server 6200 may be implemented as a memory-processor pair. In another example embodiment, each of the first server 6100 and the second server 6200 may be implemented by different numbers of processors and memories according to usage thereof.

In an example embodiment, the first server 6100 and the second server 6200 may perform communication through a first network 6010. In an example embodiment, each of the first server 6100 and the second server 6200 may access to the memory device 6310 through the first network 6010 and/or a second network 6020. In an example embodiment, each of the first server 6100 and the second server 6200 may directly or indirectly access to the storage device 6320 through the first network 6010 or the second network 6020.

In an example embodiment, an interface I/F of the storage device 6320 may include SATA, SAS, PCIe, DIMM, high bandwidth memory (HBM), hybrid memory cube (HMC), or NVDIMM. In an example embodiment, the second network 6020 may have a connection form such as a direct attached storage (DAS) method, a network attached storage (NAS) method, or a storage area network (SAN) method.

In an example embodiment, each of the memory device 6310 and the storage device 6320 may transmit device information to the server 6200 by a command or autonomously. In an example embodiment, the memory device 6310 may include a memory chip for performing the repair operation described in the aforementioned example embodiment with reference to FIGS. 1 to 18.

The data server system 6000 may perform big-data artificial intelligence calculations. The big data may include a voice, an image, a video, or weight/training data.

According to the aforementioned example embodiments, by using the memory device, the memory system including the same, and an operating method thereof, an access to old data may be available by turning off the sPPR logic by the old data access information after the post package repair operation.

Also, by using the memory device, the memory system including the same, and an operating method thereof, an access to old data may easily be performed even after the repair operation, and accordingly, reliability of data may improve.

While the example embodiments have been shown and described above, it will be apparent to those skilled in the art that modifications and variations could be made without departing from the scope of the present inventive concept as defined by the appended claims.

What is claimed is:

1. A memory device comprising:
a mode register set implemented within the memory device and configured to store a first repair mode, a second repair mode, and a second repair off mode; and
a repair control circuit configured to perform a first repair operation for permanently repairing a first wordline corresponding to a defective address to a first redundancy wordline in the first repair mode, to perform a second repair operation for temporarily repairing the first wordline corresponding to the defective address to a second redundancy wordline in the second repair mode, and activate the first wordline to access old data in the second repair off mode after the first wordline is repaired to the second redundancy wordline by the second repair operation,
wherein the old data is data stored in a memory cell connected to the first wordline.

2. The memory device of claim 1, wherein the second repair operation is prioritized by the repair control circuit, or by a controller coupled to the memory device, over the first repair operation.

3. The memory device of claim 1, wherein the repair control circuit is configured to output a hard post package repair (hPPR) wordline activation signal in response to an active row address in the first repair mode.

4. The memory device of claim 1, wherein the repair control circuit is configured to output a soft post package repair (sPPR) wordline activation signal in response to an active row address in the second repair mode.

5. The memory device of claim 4, wherein a portion of wordline activation logic of the memory device is inactivated in response to old data access information that is received after the second repair operation.

6. The memory device of claim 5, wherein the old data access information includes sPPR off information for turning off the second repair operation.

7. The memory device of claim 5, wherein activation of a repair wordline and a normal wordline is blocked in response to the sPPR wordline activation signal.

8. The memory device of claim 4, wherein the sPPR wordline activation signal is output in response to a comparison of the active row address with a row address that is stored in the memory device.

9. The memory device of claim 1, wherein the second repair operation includes: a first latch configured to latch an address in response to an active signal; a second latch configured to latch the address in response to a logic calculation value; a first logic circuit configured to output the logic calculation value by AND-calculating the active signal and a repair mode signal; and a second logic circuit configured to output a repair wordline activation signal by XOR-calculating an output value of the first latch and an output value of the second latch, and wherein the second logic circuit is inactivated in response to a repair off signal.

10. The memory device of claim 1,
wherein the first repair mode is a hard post package repair (hPPR) mode, and
wherein the second repair mode is a soft post package repair (sPPR) mode.

11. An operating method of a memory device, the method comprising:
performing a repair operation for replacing a wordline corresponding to an address with a redundancy wordline in response to a repair request from an external device;
receiving old data access information from the external device after the performing the repair operation; and
outputting old data from memory cells connected to the wordline corresponding to the address in response to a read request from the external device after the receiving the old data access information.

12. The method of claim 11, further comprising:
setting a mode register set in response to the repair request.

13. The method of claim 11, further comprising:
setting a mode register set in response to the old data access information.

14. The method of claim 11, further comprising:
receiving a write request having the old data and the address from the external device; and
writing the old data on memory cells connected to the redundancy wordline.

15. A memory system comprising:
at least one memory device; and
a controller configured to control the at least one memory device,
wherein the at least one memory device is configured to turn off a soft post package repair (sPPR) logic in response to old data access information after performing an sPPR operation, and to output old data from memory cells connected to a normal wordline or a repair wordline corresponding to an address of the controller after the sPPR operation.

16. The memory system of claim 15, wherein the controller is configured to determine whether the sPPR operation is necessary after a read operation for the at least one memory device, and to transmit an sPPR command to the at least one memory device when the sPPR operation is necessary as a result of the determination.

17. The memory system of claim 15, wherein the controller is configured to transmit an sPPR off command to the at least one memory device after the sPPR operation.

18. The memory system of claim 15, wherein the controller is configured to transmit sPPR off information to the at least one memory device along with an sPPR command.

19. The memory system of claim 15, wherein the controller is configured to transmit a read command for outputting the old data to the at least one memory device after the sPPR operation.

20. The memory system of claim 15, wherein the old data is output by the at least one memory device when the sPPR operation has not been performed on the old data.

* * * * *